(12) United States Patent
Yamamoto et al.

(10) Patent No.: US 9,013,049 B2
(45) Date of Patent: Apr. 21, 2015

(54) SURFACE SEALANT FOR OPTICAL SEMICONDUCTOR, METHOD FOR MANUFACTURING ORGANIC EL DEVICE, ORGANIC EL DEVICE AND ORGANIC EL DISPLAY PANEL USING THE SAME

(75) Inventors: Yugo Yamamoto, Chiba (JP); Jun Okabe, Ichihara (JP); Setsuko Oike, Yokohama (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 13/818,202

(22) PCT Filed: Jun. 22, 2012

(86) PCT No.: PCT/JP2012/004072
§ 371 (c)(1),
(2), (4) Date: Feb. 21, 2013

(87) PCT Pub. No.: WO2012/176472
PCT Pub. Date: Dec. 27, 2012

(65) Prior Publication Data
US 2013/0153880 A1    Jun. 20, 2013

(30) Foreign Application Priority Data

Jun. 23, 2011   (JP) .................................. 2011-139578
Jul. 12, 2011   (JP) .................................. 2011-154352

(51) Int. Cl.
| | |
|---|---|
| C08L 63/00 | (2006.01) |
| C08L 63/02 | (2006.01) |
| H01L 21/56 | (2006.01) |
| H01L 23/29 | (2006.01) |
| H01L 51/52 | (2006.01) |
| H01L 51/50 | (2006.01) |
| H01L 51/56 | (2006.01) |
| C08G 59/70 | (2006.01) |
| C08K 5/16 | (2006.01) |

(52) U.S. Cl.
CPC ........ H01L 51/5253 (2013.01); H01L 51/5246 (2013.01); H01L 51/5012 (2013.01); H01L 51/56 (2013.01); C08G 59/70 (2013.01); C08K 5/16 (2013.01); C08L 63/00 (2013.01)

(58) Field of Classification Search
None
See application file for complete search history.

(56) References Cited

U.S. PATENT DOCUMENTS

| | | |
|---|---|---|
| 4,101,514 A | 7/1978 | Thom |
| 6,353,081 B1 | 3/2002 | Palinsky et al. |
| 6,372,861 B1 | 4/2002 | Schillgalies et al. |
| 2002/0024051 A1* | 2/2002 | Yamazaki et al. ............... 257/79 |
| 2006/0036007 A1* | 2/2006 | Hsieh et al. ..................... 524/104 |
| 2006/0040201 A1 | 2/2006 | Kurakata |
| 2006/0113617 A1* | 6/2006 | Kawamura et al. ........... 257/414 |
| 2006/0243947 A1* | 11/2006 | Tsumura et al. ......... 252/299.01 |
| 2006/0247341 A1 | 11/2006 | Hsieh et al. |
| 2009/0261466 A1* | 10/2009 | Pagaila et al. .................. 257/686 |
| 2010/0051973 A1* | 3/2010 | Kobayashi et al. ............. 257/88 |

FOREIGN PATENT DOCUMENTS

| | | | |
|---|---|---|---|
| JP | 4-142070 A | * | 5/1992 |
| JP | 10-045879 A | | 2/1998 |
| JP | 2000-267359 A | | 9/2000 |
| JP | 2006-070221 A | | 3/2006 |
| JP | 2009-252364 A | | 10/2009 |
| JP | 2011-99031 A | * | 5/2011 |
| JP | 2011-099031 A | | 5/2011 |
| KR | 10-2005-0086892 A | | 8/2005 |
| WO | WO 2006/022899 A2 | | 3/2006 |
| WO | WO 2010/035502 A1 | | 4/2010 |
| WO | WO 2010/119706 A1 | | 10/2010 |

OTHER PUBLICATIONS

Doring et al., "Polymerization of epoxy resins initiated by metal complexes," Polymer International, vol. 58, No. 9, 2009, pp. 976-988.*
HCAPLUS accession No. 2009:1012117 for Doring et al., "Polymerization of epoxy resins initiated by metal complexes," Polymer International, vol. 58, No. 9, and registry No. 876132-25-1, 2009, three pages.*
HCAPLUS accession No. 2012:1900007 for instant U.S. Appl. No. 13/818,202, filed Feb. 21, 2013 and registry No. 876132-25-1, three pages.*
International Search Report (PCT/ISA/210) issued on Sep. 25, 2012, by the Japanese Patent Office as the International Searching Authority for International Application No. PCT/JP2012/004072.

* cited by examiner

*Primary Examiner* — Robert Sellers
(74) *Attorney, Agent, or Firm* — Buchanan, Ingersoll & Rooney PC

(57) ABSTRACT

To provide a resin composition for sealing an optical semiconductor, which is a raw material for a sealing resin layer having good curability and excellent storage stability; preferably a raw material for a sealing resin layer further having excellent weather resistance. The surface sealant for an optical semiconductor of Embodiment 1 according to the present invention contains epoxy resin (a) having two or more epoxy groups in a molecule, and metal complex (b1) which contains at least one metal ion selected from the group consisting of Zn, Bi, Ca, Al, Cd, La and Zr, a tertiary amine capable of forming a complex with the metal ion and having no N—H bond and an anionic ligand having a molecular weight of 17 to 200, in which the surface sealant has a viscosity of 10 to 10000 mPa·s, as measured by E-type viscometer at 25° C. and 1.0 rpm.

24 Claims, 2 Drawing Sheets

SURFACE SEALANT FOR OPTICAL SEMICONDUCTOR, METHOD FOR MANUFACTURING ORGANIC EL DEVICE, ORGANIC EL DEVICE AND ORGANIC EL DISPLAY PANEL USING THE SAME

TECHNICAL FIELD

The present invention relates to a surface sealant for an optical semiconductor, a method for manufacturing an organic EL device, an organic EL device and an organic EL display panel using the same.

BACKGROUND ART

Organic EL elements are optical semiconductor devices which have been increasingly used as backlights in liquid crystal displays and self-luminous thin flat-panel display devices. However, the organic EL elements are much more likely to be deteriorated when exposed to moisture and oxygen. More specifically, the metal electrode and organic EL layer separate from each other at their interface by the impact of moisture; metal is oxidized to cause an increase in resistance; the property of light-emitting materials contained in the light-emitting layer of the organic EL element is altered by moisture; and so forth. For these reasons, organic EL elements have the drawbacks of the loss of luminescence and/or reduced luminance. Moreover, in optical semiconductors such as inorganic LEDs, electric circuits and/or the like connected to optical semiconductors may sometimes deteriorate when they are exposed to moisture and others.

In an effort to solve the foregoing drawbacks, numerous methods have been proposed for protecting optical semiconductors such as organic EL elements from moisture and oxygen. One method involves laminating an organic EL sealant layer, which contains (A) a compound having a glycidyl group and (B) an acid anhydride curing agent as main components, onto an organic EL element (for surface sealing) and then attaching glass or film (see, e.g, Patent Literature 1).

Due to its susceptibility to degradation by moisture and/or oxygen, the organic EL element is often sealed with a laminate film formed of a resin layer made of resin and an inorganic compound layer made of inorganic compound. There are two types of methods for sealing an organic EL element with a laminate film: 1) an organic EL element is covered with an inorganic compound layer and thereafter further with a resin layer, and 2) an organic EL element is covered with a resin layer and thereafter further with an inorganic compound layer (see Patent Literature 2).

As sealants for photosensors, LEDs and/or other devices, epoxy resin compositions have been proposed that contain a compound represented by $Zn(C_nH_{2n+1}COO)_2$ and an imidazole compound serving as a curing accelerator (see, e.g., Patent Literature 3). Further, as powder coating materials, compositions containing a metal complex have been proposed wherein an amine compound and a carboxylate are coordinated with a metal ion such as a zinc ion (see, e.g., Patent Literature 4).

CITATION LIST

Patent Literature

PTL1
Japanese Patent Application Laid-Open No. 2006-70221
PTL2
Japanese Patent Application Laid-Open No. 2009-252364
PTL3
Japanese Patent Application Laid-Open No. 10-45879
PTL4
WO2006/022899

SUMMARY OF INVENTION

Technical Problem

When the viscosity of a surface sealant for an optical semiconductor greatly varies under storage conditions, the sealing conditions of the optical semiconductor must be controlled in accordance with a viscosity change of the surface sealant. As a result, the manufacturing efficiency of an optical semiconductor device disadvantageously decreases. Conversely, when the storage stability of the surface sealant is improved, the surface sealant tends to be not easily cured upon sealing of the optical semiconductor. As a result, curing time increases, thereby reducing the manufacturing efficiency of the optical semiconductor device.

In the case where an optical semiconductor, particularly a light-emitting optical semiconductor such as an organic EL device is used as a portable electronic device or lighting equipment, since it is exposed to sunlight for a long time, it must have weather resistance. Particularly, when a cured material of the surface sealant for an organic EL element is discolored by exposure to e.g., sunlight, reduction in the out-coupling efficiency and design quality has been the problem in the case of a top emission organic EL device. In the case of a back emission organic EL device, deterioration in design quality has been problematic.

On the other hand, the compositions disclosed in Patent Literature 3 are not always sufficient in curability. Furthermore, in the compositions disclosed in Patent Literature 4, storage stability can be relatively improved; however, viscosity is presumably high. Accordingly, the composition seems to be inappropriate as a sealant.

The present invention has been made in view of the aforementioned circumstances. A first object of the present invention is to provide a resin composition for sealing an optical semiconductor, which is a raw material for a sealing resin layer having good curability and excellent storage stability; preferably a raw material for a sealing resin layer further having excellent weather resistance. A second object of the present invention is to provide a resin composition for sealing an optical semiconductor, which is a raw material for a sealing resin layer having excellent weather resistance.

Solution to Problem

A first aspect of the present invention relates to a surface sealant for an optical semiconductor as described below.

[1] A surface sealant for an optical semiconductor, comprising:
an epoxy resin (a) having two or more epoxy groups in a molecule thereof; and
a metal complex (b1) which includes: at least one metal ion selected from the group consisting of Zn, Bi, Ca, Al, Cd, La and Zr; a tertiary amine capable of forming a complex with the metal ion and having no N—H bond; and an anionic ligand having a molecular weight of 17 to 200,
wherein the surface sealant has a viscosity of 10 to 10000 mPa·s, as measured by E-type viscometer at 25° C. and 1.0 rpm.

[2] The surface sealant for an optical semiconductor according to [1], wherein the valence of the anionic ligand is smaller than the valance of the metal ion and the radius of the anionic ligand is 2.0 Å or more.

[3] The surface sealant for an optical semiconductor according to [1] or [2], wherein the tertiary amine is a compound represented by any one of the following general formulas (1) to (6):

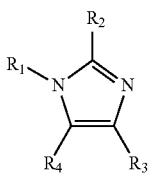
(1)

where $R_1$ represents a $C_{1-17}$ aliphatic hydrocarbon group, a hydroxy group, an aryl-containing group or a cyanoethyl group; and $R_2$, $R_3$ and $R_4$ each independently represent a hydrogen group, a $C_{1-17}$ aliphatic hydrocarbon group, a hydroxy group, an aryl-containing group or a cyanoethyl group;

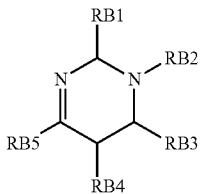
(2)

where RB1, RB3, RB4 and RB5 each independently represent a hydrogen group, a $C_{1-17}$ aliphatic hydrocarbon group optionally containing a hetero atom, a hydroxy group, an aryl-containing group or a cyanoethyl group; RB2 represents a $C_{1-17}$ aliphatic hydrocarbon group optionally containing a hetero atom, a hydroxy group, an aryl-containing group or a cyanoethyl group; and a plurality of groups selected from RB1, RB2, RB3, RB4 and RB5 optionally joined to each other to form an alicyclic ring, an aromatic ring or a heterocyclic ring having a hetero atom selected from oxygen, nitrogen and sulfur;

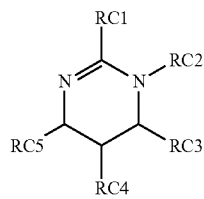
(3)

where RC1, RC3, RC4 and RC5 each independently represent a hydrogen group, a $C_{1-17}$ aliphatic hydrocarbon group optionally containing a hetero atom, a hydroxy group, an aryl-containing group or a cyanoethyl group; RC2 represents a $C_{1-17}$ aliphatic hydrocarbon group optionally containing a hetero atom, a hydroxy group, an aryl-containing group or a cyanoethyl group; and a plurality of groups selected from RC1, RC2, RC3, RC4 and RC5 optionally joined to each other to form an alicyclic ring, an aromatic ring or a heterocyclic ring having a hetero atom selected from oxygen, nitrogen and sulfur;

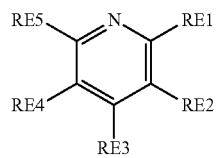
(4)

where RE1, RE2, RE3, RE4 and RE5 each independently represent a hydrogen group, a $C_{1-17}$ aliphatic hydrocarbon group optionally containing a hetero atom, a hydroxy group, an aryl-containing group or a cyanoethyl group; and a plurality of groups selected from RE1, RE2, RE3, RE4 and RE5 optionally joined to each other to form an alicyclic ring, an aromatic ring or a heterocyclic ring having a hetero atom selected from oxygen, nitrogen and sulfur;

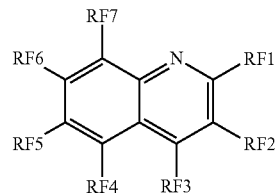
(5)

where RF1, RF2, RF3, RF4, RF5, RF6 and RF7 each independently represent a hydrogen group, a $C_{1-17}$ aliphatic hydrocarbon group optionally containing a hetero atom, a hydroxy group, an aryl-containing group or a cyanoethyl group; and a plurality of groups selected from RF1, RF2, RF3, RF4, RF5, RF6 and RF7 optionally joined to each other to form an alicyclic ring, an aromatic ring or a heterocyclic ring having a hetero atom selected from oxygen, nitrogen and sulfur; and

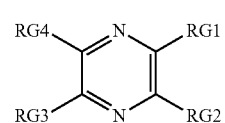
(6)

where RG1, RG2, RG3 and RG4 each independently represent a hydrogen group, a $C_{1-17}$ aliphatic hydrocarbon group optionally containing a hetero atom, a hydroxy group, an aryl-containing group or a cyanoethyl group; and a plurality of groups selected from RG1, RG2, RG3 and RG4 optionally joined to each other to form an alicyclic ring, an aromatic ring or a heterocyclic ring having a hetero atom selected from oxygen, nitrogen and sulfur.

[4] The surface sealant for an optical semiconductor according to any one of [1] to [3], wherein the anionic ligand has two or more atoms selected from the group consisting of O, S and P which are capable of binding to the metal ion, the anionic ligand being capable of coordinating with the metal ion to form a 3- to 7-membered ring.

[5] The surface sealant for an optical semiconductor according to [3], wherein the tertiary amine is a compound represented by any one of the above general formulas (1) to (3) and the anionic ligand is a carboxylate compound represented by the following general formula (7A):

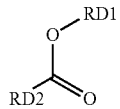
(7A)

where RD1 is free or a hydrogen atom and RD2 is a hydrogen group, a $C_{1-10}$ hydrocarbon group or a hydroxy group.

[6] The surface sealant for an optical semiconductor according to any one of [1] to [5], wherein among chemical shift peaks in $^1$HNMR spectroscopy (in CDCl$_3$, 25° C., 270 MHz) of the surface sealant, chemical shift peaks of the tertiary amine include a peak which is shifted by 0.05 ppm or more relative to a chemical shift peak in $^1$HNMR spectroscopy (in CDCl$_3$, 25° C., 270 MHz) of the tertiary amine alone.

[7] The surface sealant for an optical semiconductor according to any one of [1] to [6], wherein the molar ratio of the tertiary amine to the metal ion is 0.5:1 to 6.0:1.

[8] The surface sealant for an optical semiconductor according to [5], wherein the carboxylate compound is at least one compound selected from the group consisting of 2-ethylhexanoic acid, formic acid, acetic acid, butanoic acid, 2-ethylbutanoic acid, 2,2-dimethylbutanoic acid, 3-methylbutanoic acid, 2,2-dimethylpropanoic acid, benzoic acid and naphthenic acid.

[9] The surface sealant for an optical semiconductor according to any one of [1] to [8], wherein the tertiary amine is at least one compound selected from the group consisting of 1,8-diazobicyclo[5,4,0]undec-7-ene, 1-methylimidazole, 1,2-dimethylimidazole, 1-benzyl-2-methylimidazole, 1-isobutyl-2-methylimidazole, 1-butylimidazole and 1,5-diazobicyclo[4,3,0]non-5-en.

A second aspect of the present invention relates to a surface sealant for an optical semiconductor as described below.

[10] A surface sealant for an optical semiconductor, comprising:
an epoxy resin (a) having two or more epoxy groups in a molecule thereof;
and a curing accelerator (b2) represented by the following general formula (11) or (12),
wherein the surface sealant has a viscosity of 10 to 10000 mPa·s, as measured by E-type viscometer at 25° C. and 1.0 rpm,

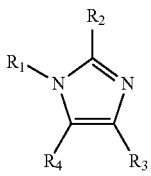

(11)

where $R_1$, $R_2$, $R_3$ and $R_4$ each independently represent a hydrogen group, a $C_{1-17}$ aliphatic hydrocarbon group, a hydroxy group, an aryl-containing group or a cyanoethyl group; with the proviso that when $R_1$ is a hydrogen group, one or both of $R_2$ and $R_4$ are aryl groups;

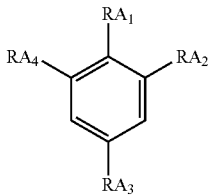

(12)

where $RA_1$, $RA_2$, $RA_3$ and $RA_4$ each independently represent a hydrogen group, a $C_{1-17}$ aliphatic hydrocarbon group, a hydroxy group, an aryl-containing group or a dimethylaminomethyl group; with the proviso that one or more groups of $RA_1$, $RA_2$, $RA_3$ and $RA_4$ are dimethylaminomethyl groups.

[11] The surface sealant for an optical semiconductor according to [10], wherein, in the above general formula (11), $R_1$ represents a $C_{1-17}$ aliphatic hydrocarbon group, a hydroxy group, an aryl-containing group or a cyanoethyl group.

[12] The surface sealant for an optical semiconductor according to any one of [1] to [9], wherein the surface sealant for an optical semiconductor contains the metal complex (b1) so that the equivalent ratio of a tertiary amine active functional group to an epoxy group is in the range of 0.008:1 to 0.3:1.

[13] The surface sealant for an optical semiconductor according to [10] or [11], wherein the surface sealant for an optical semiconductor contains the curing accelerator (b2) so that the equivalent ratio of a tertiary amine active functional group to an epoxy group is in the range of 0.008:1 to 0.152:1.

[14] The surface sealant for an optical semiconductor according to any one of [1] to [13], wherein the surface sealant for an optical semiconductor further contains an acid anhydride so that the equivalent ratio of an acid anhydride group to an epoxy group is in the range of 0.8:1 to 1.2:1.

[15] The surface sealant for an optical semiconductor according to any one of [1] to [14], wherein the surface sealant has a water content of 0.1 wt % or less.

[16] The surface sealant for an optical semiconductor according to any one of [1] to [1,5], wherein the surface sealant is a surface sealant for an organic EL element.

A third aspect of the present invention relates to a method for manufacturing an organic EL device as described below.

[17] A method for manufacturing an organic EL device, including:
a first step of forming an organic EL element on a substrate;
a second step of covering the organic EL element with the surface sealant according to Claim 1 or 10;
a third step of sealing a surface of the organic EL element with a cured material of the surface sealant; and
a fourth step of forming a passivation film on the cured material sealing the surface of the organic EL element.

[18] An organic EL device including:
an organic EL element;
a cured material layer formed of the cured material of the surface sealant according to any one of [1] to [16], the cured material layer sealing a surface of the organic EL element while being in contact with the organic EL element; and
a passivation layer in contact with the cured material layer.

[19] An organic EL device including:
an organic EL element;
a cured material layer that seals a surface of the organic EL element and is formed of an epoxy resin composition, a spectrum of X-ray photoelectron spectroscopy (XPS) of the epoxy resin composition includes a peak derived from at least one metal atom selected from the group consisting of Zn, Bi, Ca, Al, Cd, La and Zr and a peak derived from a nitrogen atom, with a molar ratio of the metal atom to the nitrogen atom being 1:0.5 to 1:6.0, the cured material layer containing the metal atom in an amount of 0.5 to 15 mass %; and
a passivation layer in contact with the cured material layer.

[20] An organic EL display panel including the organic EL device according to [18] or [19].

Advantageous Effects of Invention

The surface sealant of Embodiment 1 of the present invention has good curability and excellent storage stability. Thus, the sealing conditions of an optical semiconductor such as an organic EL element can be kept constant to some extent, and therefore the manufacturing efficiency of an optical semiconductor can be enhanced. Furthermore, use of the surface sealant of Embodiment 2 of the present invention enhances the light resistance of a sealing film of an optical semiconductor. For example, transparency thereof can be maintained.

Thus, light emitted from an optical semiconductor such as an organic EL element can be highly efficiently out-coupled and the quality of design can be maintained as well. Furthermore, light that enters the optical semiconductor can be taken in the optical semiconductor without greatly being attenuated. Thus, particularly, improvement of brightness of an organic EL element can be realized.

DESCRIPTION OF EMBODIMENTS

1. Epoxy Resin Composition

Figure 1A:
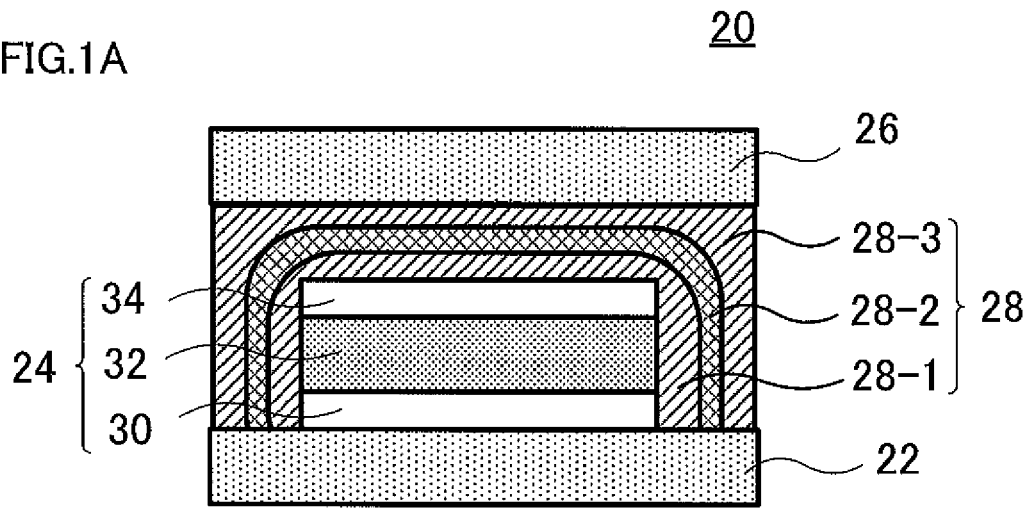
FIGS. 1A and 1B schematically show a section of a surface-sealed organic EL device.

The epoxy resin composition of the present invention contains an epoxy resin (a) and an amine compound (b); and can further contain an acid anhydride (c) and other components. The epoxy resin composition of the present invention can be used, for example, as a surface sealant or transparent filler, preferably, as a surface sealant. The transparent filler refers to a material required to be transparent for filling a gap between a substrate such as a touch panel and an image display apparatus such as a liquid crystal panel. Hereinafter, an example will be described where the epoxy resin composition of the present invention is used as a surface sealant. The surface sealants of the present invention include surface sealants of Embodiments 1 and 2 later described.

Epoxy Resin (a)

The epoxy resin (a) contained in the surface sealant of the present invention is not limited in molecular weight and/or the like as long as it is an epoxy resin having two or more epoxy groups in a molecule thereof; epoxy resins with and without molecular weight distribution can be both used.

Examples of the epoxy resin having two epoxy groups in a molecule thereof include hydroquinone diglycidyl ether, resorcinol diglycidyl ether, ethylene glycol diglycidyl ether, polyethylene glycol diglycidyl ether, 1,4-butanediol diglycidyl ether, 1,6-hexanediol diglycidyl ether, cyclohexanediol diglycidyl ether, cyclohexanedimethanol diglycidyl ether, dicyclopentadienediol diglycidyl ether, 1,6-naphthalenediol diglycidyl ether, bisphenol A diglycidyl ether, bisphenol F diglycidyl ether, hydrogenated bisphenol A diglycidyl ether and hydrogenated bisphenol F diglycidyl ether.

Examples of an epoxy resin compound having three or more epoxy groups in a molecule thereof include trimethylolpropane triglycidyl ether, pentaerythritol tetraglycidyl ether, phenol novolac epoxy, and cresol novolac epoxy.

Furthermore, the epoxy resin may contain a polymer or oligomer having an epoxy group. The polymer or oligomer having an epoxy group is not particularly limited; it can be obtained by polymerizing e.g., a vinyl monomer having an epoxy group. Preferable examples of the vinyl monomer having an epoxy group include (meth)acrylate monomers such as glycidyl (meth)acrylate, 3,4-epoxycyclohexylmethyl (meth)acrylate, and methylglycidyl (meth)acrylate.

The epoxy resin may be a copolymer or cooligomer of a vinyl monomer having an epoxy group and e.g., another vinyl monomer. Examples of the other vinyl monomer include (meth)acrylates. The ester group of the (meth)acrylates is preferably a linear or branched nonfunctional alkyl such as methyl group, ethyl group, isopropyl group, normal butyl group, isobutyl group, tertiary butyl group, 2-ethylhexyl group, cyclohexyl group, benzyl group, isobornyl group, lauryl group, or myristyl group. Furthermore, the epoxy resin may be a copolymer of a vinyl monomer having an epoxy group and e.g., styrene, α-methylstyrene, vinyl acetate and/or other monomers.

Preferable specific examples of epoxy resin (a) contained in the surface sealant of the present invention include tetrafunctional naphthalene epoxy resin (a-a), triphenylmethane epoxy resin (a-b), dicyclopentadiene epoxy resin (a-c), ortho cresol novolac epoxy resin (a-d), phenol novolac epoxy resin (a-e), fluorene epoxy resin (a-f), and bisphenol trifunctional epoxy resin (a-g). The structural formula of an example of each epoxy resin is shown below.

An example of tetrafunctional naphthalene epoxy resin (a-a)

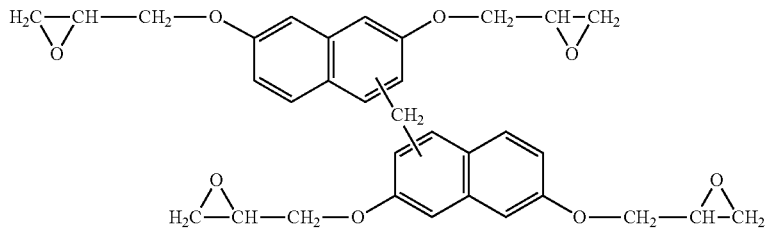

An example of triphenylmethane epoxy resin (a-b)

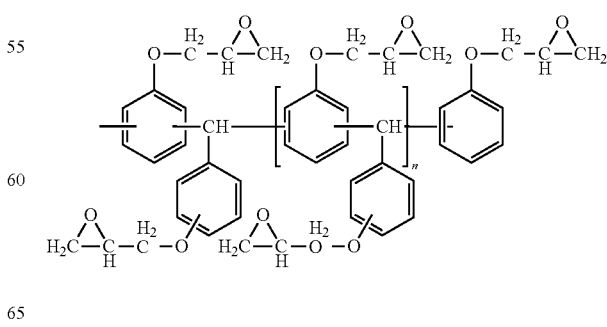

wherein n represents an integer.

An example of dicyclopentadiene epoxy resin (a-c)

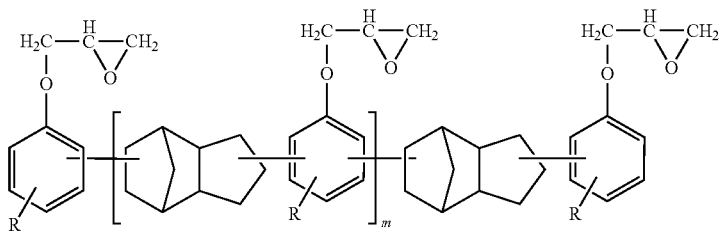

wherein m represents an integer, and each R independently represents a $C_{1-5}$ alkyl group.

An example of ortho-cresol novolac epoxy resin (a-d)

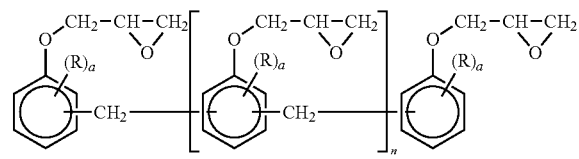

wherein n represents an integer, and each R independently represents a $C_{1-5}$ alkyl group.

An example of phenol novolac epoxy resin (a-e)

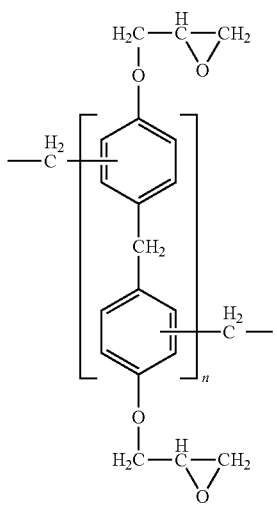

wherein n represents an integer.

An example of fluorene epoxy resin (a-f)

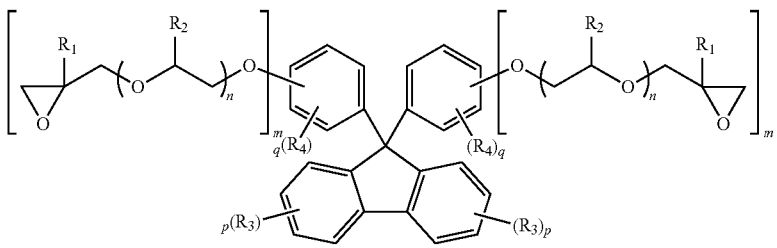

wherein each $R_1$ independently represents a hydrogen atom or a methyl group; each $R_2$ independently represents a hydrogen atom or a methyl group; each $R_3$ independently represents a $C_{1-5}$ alkyl group; n represents an integer of 0 to 3; m represents an integer of 1 to 3; p represents an integer of 0 to 4; and q represents an integer of 0 to 4.

An example of bisphenol trifunctional epoxy resin (a-g)

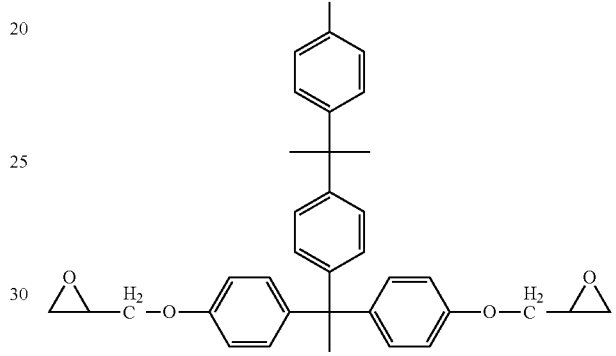

Since the epoxy resins (a-a) to (a-g) have a bulky group (aryl group), the heat resistance of resin cured materials containing these epoxy resins tends to increase. Furthermore, not only transparency but also adhesiveness of the resin cured materials containing these epoxy resins tends to increase. Moreover, the viscosity of surface sealants containing these epoxy resins tends can be easily controlled within a desired range (10 to 10,000 mPa·s as measured by E-type viscometer at 25° C. and 1.0 rpm). Thus, the surface sealant of the present invention is easily formed into a film by e.g., screen printing.

However, when resin cured materials containing these epoxy resins having a bulky group are exposed to plasma, haze easily increases as transparency decreases. In contrast, in the surface sealant of the present invention formulated with a specific amine compound (b2), a reduction of transparency and an increase of haze of its resin cured material are limited In order to easily control the viscosity of the surface sealant of the present invention to fall within the range later described, it is preferable to add at least low molecular weight epoxy resin (a-1) as epoxy resin (a). Furthermore, when necessary, high molecular weight epoxy resin (a-2) can be further added to the surface sealant of the present invention to obtain a molded article (e.g., sheet) for surface sealing.

Low molecular weight epoxy resin (a-1) is an epoxy resin having a weight-average molecular weight of 200 to 800; and preferably, an epoxy resin having a weight average molecular weight of 300 to 700. The "weight average molecular weight (Mw)" is measured by gel permeation chromatography (GPC) using polystyrene as a standard.

Examples of epoxy resin (a-1) include a bisphenol epoxy compound, a phenol novolac epoxy compound, and a cresol novolac epoxy compound. Examples of the bisphenol epoxy compound include a compound represented by general formula (X), and a preferable example includes a compound represented by general formula (X').

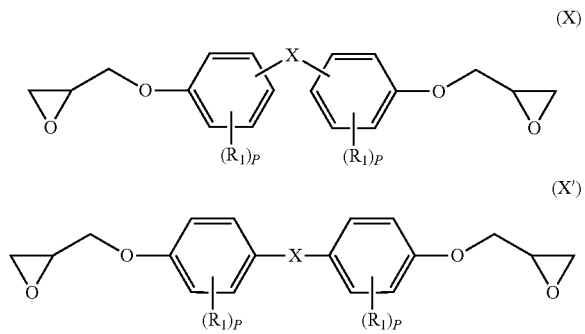

In general formula (X), X represents a single bond, a methylene group, an isopropylidene group, —S— or —SO$_2$—; plural $R_1$ each independently represent a $C_{1-15}$ alkyl group; n represents an integer of 2 or more; and P represents an integer of 0 to 4.

In an oligomer containing a phenol derivative and epichlorohydrin as the monomer units, examples of the phenol derivative include bisphenol, hydrogenated bisphenol, phenol novolac, and cresol novolac.

Preferable examples of low molecular weight epoxy resin (a-1) include an oligomer containing a bisphenol epoxy compound or a bisphenol and epichlorohydrin as the monomer units, and more preferable examples thereof include an oligomer represented by the above-described general formula (X) in which repeat number n is 2 to 4. Such an oligomer has high affinity for high molecular weight epoxy resin (a-2), which can be optionally formulated with the surface sealant of the present invention when obtaining a molded article for surface sealing later described. The repeat unit contained in low molecular weight epoxy resin (a-1) may be the same or different from that contained in high molecular weight epoxy resin (a-2).

The epoxy equivalent of low molecular weight epoxy resin (a-1) is preferably 100 to 800 g/eq.

Low molecular weight epoxy resin (a-1) contained in the sealing composition of the present invention mainly functions to enhance the flowability of a sealing sheet when it is thermally pressure-bonded to an element, so as to increase its adhesion to the element.

A molded article for surface sealing such as a sheet can be obtained by using the surface sealant of the present invention. The molded article for surface sealing may contain either one or both of high molecular weight epoxy resin (a-2) and low molecular weight epoxy resin (a-1).

Examples of high molecular weight epoxy resin (a-2) include a resin or oligomer containing a phenol resin and epichlorohydrin as the monomer units. High molecular weight epoxy resin (a-2) is preferably such an oligomer. The phenol resin includes a hydroxyaryl resin such as a naphthol resin. The weight-average molecular weight (Mw) of high molecular weight phenol epoxy resin (a-2) is $3 \times 10^3$ to $2 \times 10^4$, and preferably, $3 \times 10^3$ to $7 \times 10^3$. The "weight average molecular weight (Mw)" is measured by gel permeation chromatography (GPC) using polystyrene as a standard.

By use of epoxy resin (a-2) having a weight average molecular weight (Mw) within the above numerical value range, a molded article for surface sealing from which a sealing film having strong adhesive force and low water vapor permeability is produced can be obtained. Furthermore, a surface sealant containing epoxy resin (a-2) having a weight average molecular weight (Mw) within the above-described numerical value range is easily applied and readily formed into a sheet.

The weight average molecular weight (Mw) of epoxy resin (a-2) is appropriately controlled so as not to be excessively high. Because of this, a cured material (sealing member) obtained by curing the surface sealant of the present invention has low water vapor permeation and high adhesive force.

Epoxy resin (a-2) is preferably an oligomer containing a phenol resin and epichlorohydrin as monomer components. All of the monomer units of epoxy resin (a-2) may be constituted of phenol resin and epichlorohydrin. Alternatively, some of the monomer units may be constituted of a compound other than the phenol resin and epichlorohydrin (i.e., include comonomer units). When the above comonomer units are employed as some of the monomer units, the weight-average molecular weight (Mw) of resultant epoxy resin (a-2) is easily controlled to be a desired value. By appropriately selecting monomer units of epoxy resin (a-2), smoothness of the surface of a coating film formed of the sealing composition can be improved.

The epoxy equivalent of epoxy resin (a-2) is preferably 500 to 10000 g/eq.

In the epoxy resin contained in the molded article for surface sealing of the present invention, the proportions of high molecular weight epoxy resin (a-2) and low molecular weight epoxy resin (a-1) are not particularly limited and the composition is preferably controlled so as to realize a desired viscosity. When the content of high molecular weight epoxy resin (a-2) is excessively high, the water vapor permeability of a cured material (sealing member) tends to increase. In addition, the flowability thereof at the time of pressure-bonding to e.g., an organic EL element decreases, with the result that a gap is easily formed between the sealing sheet and e.g., the organic EL element. In contrast, when the content of high molecular weight epoxy resin (a-2) is excessively low, it may reduce the handleability of the surface sealant.

Amine Compound (b)

Amine compound (b) contained in the surface sealant of the present invention can be tertiary amine metal complex (b1) or specific amine compound (b2). These amine compounds (b) are capable of functioning as a curing accelerator.

More specifically, the surface sealant according to Embodiment 1 of the present invention contains tertiary amine metal complex (b1). Tertiary amine metal complex (b1) contains a metal ion, a tertiary amine coordinated with the metal ion, and an anionic ligand coordinated with or ion-bound to the metal ion.

The metal ion in the metal complex (b1) may be a metal ion selected from the group consisting of Zn, Bi, Ca, Al, Cd, La and Zr. From the perspective of improving transparency of the surface sealant, Zn is preferable. Furthermore, when metal complex (b1) contains two or more metal ions, it suffices when at least one of the metal ions is a metal ion selected from Zn, Bi, Ca, Al, Cd, La and Zr.

The tertiary amine in metal complex (b1) preferably is capable of forming a complex with a metal ion and has no N—H bond, in order to reduce the reactivity of the tertiary amine under storage conditions. Furthermore, the molecular weight of the tertiary amine in metal complex (b1) is preferably 65 to 300. When the molecular weight of the tertiary amine is excessively large, the solubility of metal complex (b1) in the surface sealant decreases and/or catalyst activity reduces.

The tertiary amine in metal complex (b1) is preferably any one of the compounds represented by the following general formulas (1) to (6). It is conceivable that each of these compounds is likely to stably form a complex with a metal ion since electron clouds in the conjugated system localize on the nitrogen atom in the ring. Furthermore, as described later, the cured material layer of a surface sealant containing any one of these compounds does not easily lose transparency and therefore does not easily cause an increase in haze even when treated with plasma, exhibiting good plasma resistance and weather resistance.

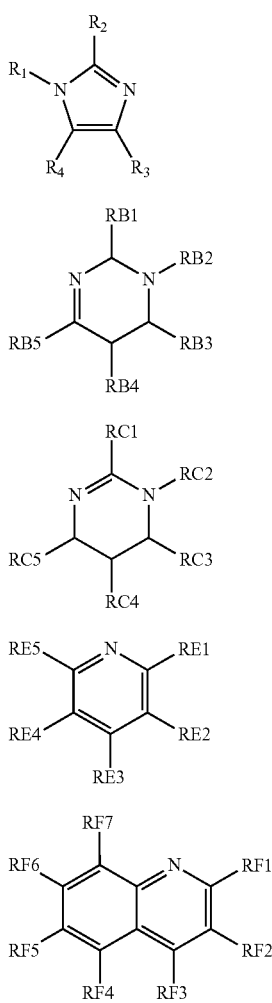

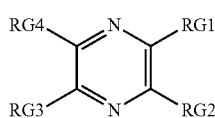

In general formula (1), $R_2$, $R_3$ and $R_4$ are each independently a hydrogen atom, a $C_{1-17}$ aliphatic hydrocarbon group, a hydroxy group, an aryl-containing group or a cyanoethyl group. The $C_{1-17}$ aliphatic hydrocarbon group is preferably a $C_{1-6}$ alkyl group. Examples of the aryl-containing group include aryl groups such as phenyl group and naphthyl group and, arylalkyl groups such as benzyl group. The number of carbon atoms constituting the aryl-containing group preferably falls within the range of 6 to 11.

$R_1$ is a substituent except hydrogen atom (aliphatic hydrocarbon group, an aryl group, a hydroxy group or a cyanoethyl group). When $R_1$ is a hydrogen atom, compared to the case where $R_1$ is another substituent, the transparency of a sealing layer formed of a cured material of the surface sealant, may be reduced by e.g., plasma exposure.

Specific examples of the amine compound represented by general formula (1) include the following 1-methylimidazole, 1,2-dimethylimidazole, 1-benzyl-2-methylimidazole, 1-isobutyl-2-methylimidazole, 1-butylimidazole, 1-benzyl-2-phenylimidazole and 2-phenyl-4-methylimidazole.

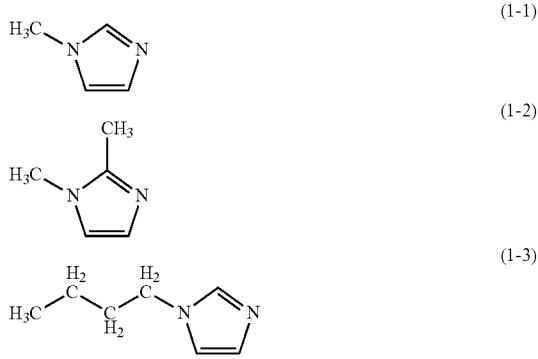

In general formula (2), RB1, RB3, RB4 and RB5 each independently represent a hydrogen atom, a $C_{1-17}$ aliphatic hydrocarbon group which may contain a hetero atom, a hydroxy group, an aryl-containing group or a cyanoethyl group; RB2 represents a $C_{1-17}$ aliphatic hydrocarbon group optionally containing a hetero atom, a hydroxy group, an aryl-containing group or a cyanoethyl group; and a plurality of groups appropriately selected from RB1, RB2, RB3, RB4 and RB5 optionally joined to each other to form an alicyclic ring, an aromatic ring or a heterocyclic ring having a hetero atom selected from oxygen, nitrogen and sulfur.

The $C_{1-17}$ aliphatic hydrocarbon group is preferably a $C_{1-6}$ alkyl group. Examples of the aryl-containing group include aryl groups such as phenyl group and naphthyl group, and arylalkyl groups such as benzyl group. The number of carbon atoms constituting the aryl-containing group preferably falls within the range of 6 to 11.

Specific examples of the amine compound represented by general formula (2) include the following 1,8-diazobicyclo[5,4,0]undec-7-ene.

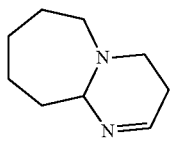

(2-1)

In general formula (3), RC1, RC3, RC4 and RC5 each independently represent a hydrogen atom, a $C_{1-17}$ aliphatic hydrocarbon group optionally containing a hetero atom, a hydroxy group, an aryl-containing group or a cyanoethyl group; RC2 represents a $C_{1-17}$ aliphatic hydrocarbon group optionally containing contain a hetero atom, a hydroxy group, an aryl-containing group or a cyanoethyl group; and a plurality of groups appropriately selected from RC1, RC2, RC3, RC4 and RC5 optionally joined to each other to form an alicyclic ring, an aromatic ring or a heterocyclic ring having a hetero atom selected from oxygen, nitrogen and sulfur.

The $C_{1-17}$ aliphatic hydrocarbon group is preferably a $C_{1-6}$ alkyl group. Examples of the aryl-containing group include aryl groups such as phenyl group and naphthyl group, and arylalkyl groups such as benzyl group. The number of carbon atoms constituting the aryl-containing group preferably falls within the range of 6 to 11.

Specific examples of the amine compound represented by general formula (3) include the following 1,5-diazobicyclo[4,3,0]non-5-ene.

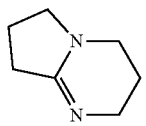

(3-1)

In general formula (4), RE1, RE2, RE3, RE4 and RE5 each independently represent a hydrogen group, a $C_{1-17}$ aliphatic hydrocarbon group optionally containing a hetero atom, a hydroxy group, an aryl-containing group or a cyanoethyl group; and a plurality of groups selected from RE1, RE2, RE3, RE4 and RE5 optionally containing joined to each other to form an alicyclic ring, an aromatic ring or a heterocyclic ring having a hetero atom selected from oxygen, nitrogen and sulfur.

The $C_{1-17}$ aliphatic hydrocarbon group is preferably a $C_{1-6}$ alkyl group. Examples of the aryl-containing group include aryl groups such as phenyl group and naphthyl group, and arylalkyl groups such as benzyl group. The number of carbon atoms constituting the aryl-containing group preferably falls within the range of 6 to 11.

Specific examples of the amine compound represented by general formula (4) include the following compound represented by the following formula (4-1).

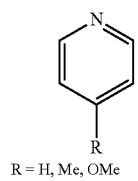

(4-1)

R = H, Me, OMe

In general formula (5), RF1, RF2, RF3, RF4, RF5, RF6 and RF7 each independently represent a hydrogen group, a $C_{1-17}$ aliphatic hydrocarbon group optionally containing contain a hetero atom, a hydroxy group, an aryl-containing group or a cyanoethyl group; and a plurality of groups selected from RF1, RF2, RF3, RF4, RF5, RF6, and RF7 optionally joined to each other to form an alicyclic ring, an aromatic ring or a heterocyclic ring having a hetero atom selected from oxygen, nitrogen and sulfur.

The $C_{1-17}$ aliphatic hydrocarbon group is preferably a $C_{1-6}$ alkyl group. Examples of the aryl-containing group include aryl groups such as phenyl group and naphthyl group, and arylalkyl groups such as benzyl group. The number of carbon atoms constituting the aryl-containing group preferably falls within the range of 6 to 11.

Specific examples of the amine compound represented by general formula (5) include the following compound represented by the following formula (5-1).

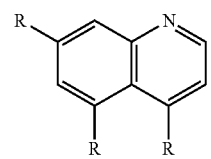

(5-1)

R = H, Me, OMe

In general formula (6), RG1, RG2, RG3 and RG4 each independently represent a hydrogen group, a $C_{1-17}$ aliphatic hydrocarbon group optionally containing a hetero atom, a hydroxy group, an aryl-containing group or a cyanoethyl group; and a plurality of groups selected from RG1, RG2, RG3 and RG4 optionally joined to each other to form an alicyclic ring, an aromatic ring or a heterocyclic ring having a hetero atom selected from oxygen, nitrogen and sulfur.

The $C_{1-17}$ aliphatic hydrocarbon group is preferably a $C_{1-6}$ alkyl group. Examples of the aryl-containing group include aryl groups such as phenyl group and naphthyl group, and arylalkyl groups such as benzyl group. The number of carbon atoms constituting the aryl-containing group preferably falls within the range of 6 to 11.

Specific examples of the amine compound represented by general formula (6) include the following compound represented by the following formula (6-1).

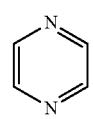

(6-1)

Of these tertiary amines, for example, a compound represented by formula (4) has a pKa of about 5; whereas, a compound represented by formula (1) has a pKa of about 7 and diazabicycloundecene, which is one of the compounds represented by formula (2), has a pKa of about 12. More specifically, the compounds represented by formulas (1) and (2) tend to exhibit higher basicity than a compound represented by formula (4). More specifically, since the tertiary amine in metal complex (b1) has a high degree of basicity and has a good curing activity with respect to epoxy resin, the tertiary amine is preferably a compound represented by any one of general formulas (1) to (3).

Tertiary amines forming a complex with a metal ion may be used alone or in combination. More specifically, the metal complex (b1) may be a multinuclear complex containing a plurality of metal ions as the core metals.

The molar ratio of tertiary amine to metal ion in metal complex (b1) is preferably 0.5:1 to 6.0:1, and further preferably 0.6:1 to 2.0:1. When the molar ratio is 0.5 or more, the number of tertiary amines to be coordinated with metal complex (b1) is high, with the result that the curability of a surface sealant tends to be satisfactory. In contrast, when the molar ratio is 6.0 or less, the number of tertiary amines to be coordinated with metal complex (b1) is low, with the result that the storage stability of the surface sealant becomes satisfactory. When the molar ratio falls within the above range, the balance between curability and storage stability becomes satisfactory.

The anionic ligand in a metal complex (b1) is a compound having an acidic group having an atom selected from the group consisting of O, S, P and halogen and binding to a metal ion by a coordinate bond or an ion bond.

The valence of an anionic ligand is preferably smaller than the valence of a metal ion. When an anionic ligand has a smaller valence than a metal ion, two or more anionic ligands can be bound to a single metal ion to stabilize metal complex (b1).

The molecular weight of the anionic ligand is preferably 17 to 200. When the molecular weight of the anionic ligand is 17 or more, the coordination bond distance between the metal ion and tertiary amine is likely to decrease, as described later. Thus, it is considered that the curability of metal complex (b1) is not easily compromised. In contrast, when the molecular weight of an anionic ligand is 200 or less, the size of anionic ligand is not excessively large. Thus, it is considered that coordination of a tertiary amine with a metal ion is not significantly inhibited by sterical hindrance of the ligand. As a result, it is considered that metal complex (b1) is not easily destabilized under storage conditions.

The radius of the anionic ligand is preferably 2.0 Å or more, and more preferably 2.4 Å or more. This is to obtain good curability of a metal complex (b1). For example, assuming that two anionic ligands are coordinated with a metal ion, when a tertiary amine is further coordinated with the metal ion, the angle formed between one of the bonds between the anionic ligand and the metal ion and the other bond is considered to be narrowed, thereby providing stabilization. When the radius of the anionic ligand is 2.0 Å or more, it is difficult to reduce the angle formed between these bonds. Consequently, the coordination bond distance between a metal ion and a tertiary amine is conceivably easily decreased. As a result, it is considered that the curability of metal complex (b1) is not easily compromised. When the curability of metal complex (b1) is not easily impaired, particularly the degree of curing the surface of a cured material tends to increase. When the degree of curing the surface of a cured material is high, when e.g., a passivation layer is formed on the surface of the cured material, the surface of the cured material does not easily lose smoothness. Because of this, it is considered that the external haze of the cured material does not easily increase and thus transparency is not easily compromised.

On the other hand, the upper limit of the radius of the anionic ligand can be set to about 200 Å. When the radius of the anionic ligand is 200 Å or less, it is considered that coordination of a tertiary amine with a metal ion is not significantly inhibited by sterical hindrance of the anionic ligand having such a size. As a result, it is considered that metal complex (b1) is not easily destabilized under storage conditions.

The radius of an anionic ligand is computationally obtainable by determining the Connolly volume of the anionic ligand and calculating the radius of a true sphere which has the same volume as the Connolly volume.

The Connolly volume of an anionic ligand can be computationally obtained by optimizing the structure of the anionic ligand followed by calculation using, for example, Material Studio 6.0 Dmol3. The optimization of the structure of the anionic ligand can be made by MM2 (molecular mechanics calculation method) or PBE/DNP 4.4. After optimizing the structure of an anionic ligand in this manner, a Connolly volume is obtained with the Connolly radius being set to 1.0 Å.

By way of example, calculation of the radius of an acetic acid ion will be described. The Connelly volume of an acetic acid ion, as obtained by the aforementioned method, is 54.8 Å. Assuming that this volume is equal to the volume of a true sphere, the radius of the true sphere is calculated, which is about 2.36 Å. This value can be defined as the radius of the acetic acid ion (ligand).

As the radiuses of e.g., chloride ion and sulfuric acid ion, ion radiuses (calculated values by Shannon and Prewitt) described in Chemical handbook, basic version, revised second edition, edited by the Chemical Society of Japan) can be used.

It is more preferable that the valence of an anionic ligand is smaller than that of a metal ion and the radius of the anionic ligand is 2.0 Å or more (preferably, 2.4 Å or more).

Examples of the anionic ligand can include carboxylate compounds, 1,3-dicarbonyl compounds, dithiocarboxylic acids and their carboxylate anions; thiocarboxylic acids and their carboxylate anions, thionocarboxylic acids and their carboxylate anions, 1,3-dithiocarbonyl compounds, nitroxide ion, and halogen ions.

The carboxylate compound is preferably a compound represented by the following formula (7A).

(7A)

In general formula (7A), RD1 is free or represents a hydrogen atom; and RD2 represents a hydrogen group, a $C_{1-10}$ hydrocarbon group or a hydroxy group. The $C_{1-10}$ hydrocarbon group may be a $C_{1-10}$ alkyl group or a $C_{6-10}$ aryl-containing group and preferably a straight or branched $C_{1-7}$ alkyl group. The phrase that RD1 is free means that a carboxylate compound is an anion, as shown in the following formula (7B). In the case where RD1 is a hydrogen group, a hydroxy group is coordinated with a metal ion; whereas in the case where RD1 is free, O⁻ is often coordinated with a metal ion.

(7B)

Examples of the carboxylate compound represented by formula (7A) include a $C_{2-10}$ alkylcarboxylic acid and a carboxylate anion thereof, and a $C_{7-10}$ arylcarboxylic acid and a carboxylate anion thereof.

Examples of the $C_{1-10}$ alkylcarboxylic acid include formic acid, acetic acid, butanoic acid, 2-ethylbutanoic acid, 2,2-dimethylbutanoic acid, 2-ethylhexanoic acid, 3-methylbutanoic acid and 2,2-dimethylpropanoic acid, and particularly formic acid, acetic acid, and 2-ethylhexanoic acid are preferable.

(7A-1)

(7A-2)

(7A-3)

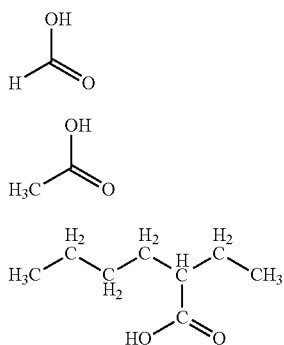

Examples of the $C_{7-10}$ arylcarboxylic acid include benzoic acid and naphthenic acid.

The 1,3-dicarbonyl compound is preferably a compound represented by formula (8).

$$R1-(C=O)-CH=C(O)-R2 \quad (8)$$

In formula (8), R1 and R2 are each independently a $C_{1-10}$ alkyl group or a $C_{6-10}$ aryl group. The $C_{1-10}$ alkyl group can be e.g., methyl group and ethyl group. The $C_{6-10}$ aryl group can be e.g., phenyl group and naphthyl group. Examples of the 1,3-dicarbonyl compound include acetyl acetonate.

Examples of the dithiocarboxylic acid and carboxylate anion thereof include a $C_{1-10}$ alkyldithiocarboxylic acid and a dithiocarboxylate anion thereof, and a $C_{7-15}$ aryldithiocarboxylic acid and a dithiocarboxylate anion thereof.

Examples of the $C_{1-10}$ alkyldithiocarboxylic acid include dithioformic acid, dithioacetic acid, dithiopropanoic acid and dithio-2-ethyl hexanoic acid.

Examples of the thiocarboxylic acid and a carboxylate anion thereof include a $C_{1-10}$ alkylthiocarboxylic acid and an alkyl thiocarboxylate anion thereof, and a $C_{7-15}$ arylthiocarboxylic acid and an arylthiocarboxylate anion thereof.

Examples of the $C_{1-10}$ alkylthiocarboxylic acid include thioacetic acid and thio-2-ethylhexanoic acid.

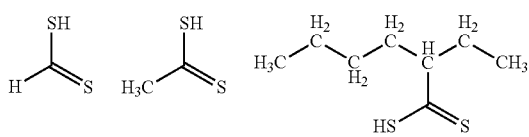

Examples of the thionocarboxylic acid and a carboxylate anion thereof include a $C_{1-10}$ alkylthionocarboxylic acid and an alkylthionocarboxylate anion thereof, and a $C_{7-15}$ arylthionocarboxylic acid and arylthionocarboxylate anion thereof.

Examples of the $C_{1-10}$ alkylthionocarboxylic acid include thionoacetic acid and thiono-2-ethylhexanoic acid.

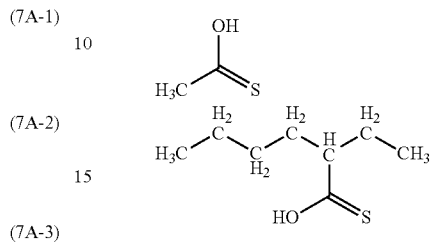

The 1,3-dithiocarbonyl compound is preferably a compound represented by formula (9).

$$R3-(C=S)-CH=C(S)-R4 \quad (9)$$

In formula (9), R3 and R4 are each independently a $C_{1-10}$ alkyl group or a $C_{6-10}$ aryl group. The $C_{1-10}$ alkyl group can be e.g., a methyl group, an ethyl group. The $C_{6-10}$ aryl group can be e.g., a phenyl group and a naphthyl group.

Examples of nitroxide ion include $NO_3^-$. Examples of the halogen ion include $Br^-$.

The number of atoms contained in the anionic ligand (i.e., atoms capable of binding to a metal ion), which are selected from O, S, P and halogens, may be single or two or more. The anionic ligand containing two or more atoms capable of binding to a metal ion may be bound to the metal ion via a single atom or via each of the two or more of the atoms. In order to form a ring with the metal ion to allow metal complex (b1) to electrically stabilize and to ensure good curability of metal complex (b1), the number of the atoms capable of binding to a metal ion contained in the anionic ligand is preferably two or more.

The anionic ligand containing two or more atoms capable of binding to a metal ion is preferably capable of forming a 3- to 7-membered ring with the metal ion. Preferable examples of such an anionic ligand include a carboxylate compound represented by the above formula (7A). The carboxylate compound represented by the above formula (7A) is capable of binding to a metal ion via either one of the oxygen atom constituting a carbonyl group or the oxygen atom adjacent to the carbonyl group.

Metal complex (b1) is preferably a compound in which a tertiary amine represented by any one of aforementioned general formulas (1) to (3) and a carboxylate compound represented by the aforementioned general formula (7A) are separately coordinated with a metal ion.

The tertiary amine to be coordinated with a metal ion may be one or two or more of the above general formulas (1) to (3).

In order for the surface sealant of the present invention to be cured at a temperature at which deterioration of an organic EL element is limited while maintaining storage stability, metal complex (b1) is preferably a complex in which two of the amine compounds represented by general formulas (1) to (3) and two of the carboxylate compounds represented by general formula (7A) are coordinated with a metal ion.

Specifically, a metal complex represented by the following general formula (10) is preferable.

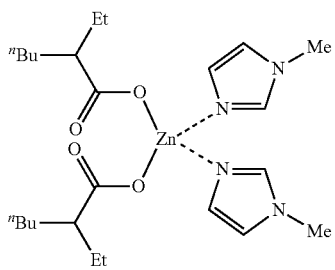

(10)

To easily dissolve in e.g., epoxy resin (a) and optional acid anhydride (c), the metal complex (b1) preferably has a close polarity to those. Furthermore, to easily dissolve in e.g., epoxy resin (a) and optional acid anhydride (c), the tertiary amine in metal complex (b1) preferably also has a polarity close to them.

Whether or not a tertiary amine formed a complex with a metal ion can be confirmed by comparing the $^1$HNMR chemical shift of the tertiary amine in metal complex (b1) with the $^1$HNMR chemical shift of the tertiary amine alone. More specifically, when chemical shift peaks in $^1$HNMR spectroscopy (in CDCl$_3$, 25° C., 270 MHz) of the tertiary amine in metal complex (b1) include a peak which is shifted by 0.05 ppm or more, preferably 0.1 ppm or more, and more preferably 0.4 ppm or more, relative to the chemical shift peak in $^1$HNMR spectroscopy (in CDCl$_3$, 25° C., 270 MHz) of the tertiary amine alone, it can be confirmed that the tertiary amine formed a complex with a metal ion. The upper-limit displacement of the peak is not particularly limited; however, it is usually, about 1 ppm and more generally 0.7 ppm in most cases.

Whether or not a tertiary amine in the surface sealant formed a complex with a metal ion (i.e., whether or not the surface sealant contains metal complex (b1)) can be confirmed also by comparing, among $^1$HNMR chemical shifts of the surface sealant, the chemical shift of the tertiary amine with the $^1$HNMR chemical shift of the tertiary amine alone. Also in this case, similarly to the above-described case, when chemical shift peaks in $^1$HNMR spectroscopy (in CDCl$_3$ 25° C., 270 MHz) of the surface sealant include, among chemical shift peaks of the tertiary amine, a peak which is shifted by 0.05 ppm or more, preferably, 0.1 ppm or more, and more preferably, 0.4 ppm or more, relative to the chemical shift peak in $^1$HNMR spectroscopy (in CDCl$_3$, 25° C., 270 MHz) of the tertiary amine alone, it can be confirmed that the tertiary amine in the surface sealant forms a complex with a metal ion. The upper-limit displacement of the peak can be about 1 ppm and preferably about 0.7 ppm, similarly to the above case.

Moreover, whether a tertiary amine in the surface sealant formed a complex with a metal ion (i.e., whether a surface sealant contains metal complex (b1)) can be confirmed also by comparing the $^1$HNMR chemical shifts of the surface sealant with the $^1$HNMR chemical shift of metal complex (b1) alone. For example, when the similar chemical shift as that of metal complex (b1) alone appears in the $^1$HNMR chemical shift of the surface sealant, it can be determined that the surface sealant contains metal complex (b1).

The peak which is shifted in $^1$HNMR spectroscopy is conceivably derived from a hydrogen atom whose electron state is changed by coordination of a tertiary amine with a metal ion. In many case, such a hydrogen atom is presumably a hydrogen atom present around the conjugated system including a nitrogen atom. For example, when the tertiary amine is an imidazole compound represented by formula (1), the peak which is shifted in $^1$HNMR spectroscopy is mostly derived from the 4-position or the 5-position hydrogen atom.

A tertiary amine having no bulky group around the hydrogen atom present around the conjugated system including a nitrogen atom is probably coordinated with a metal ion, since the nitrogen atom contained in the conjugated system is likely to come closer to the metal ion.

The content of metal complex (b1) in the surface sealant is preferably 0.008:1 to 0.3:1 in terms of the equivalent ratio of "active functional group (tertiary amino group) of the metal complex (b1) to epoxy group contained in the surface sealant". To enhance the curability of a surface sealant, the equivalent ratio is preferably 0.01:1 to 0.2:1 and more preferably 0.03:1 to 0.152:1. The metal complex (b1) may be constituted of one or two or more of the metal complexes.

The surface sealant according to Embodiment 2 of the present invention contains specific amine compound (b2). Specific amine compound (b2) is represented by general formula (11) or (12).

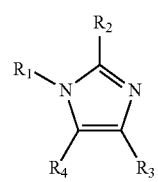

(11)

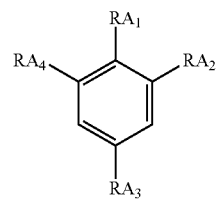

(12)

In general formula (11), $R_1$ to $R_4$ are each independently a hydrogen atom, a $C_{1-17}$ aliphatic hydrocarbon group, an aryl-containing group, a hydroxy group and a cyanoethyl group. The $C_{1-17}$ aliphatic hydrocarbon group is preferably a $C_{1-6}$ alkyl group. Examples of the aryl-containing group include an aryl group such as a phenyl group and a naphthyl group and an arylalkyl group such as a benzyl group. The number of carbon atoms constituting the aryl-containing group preferably falls within the range of 6 to 11.

$R_1$ is preferably a substituent (an aliphatic hydrocarbon group, an aryl group, a hydroxy group or a cyanoethyl group) except a hydrogen atom. If $R_1$ is a hydrogen atom, the transparency of a sealing layer formed of a cured material of the surface sealant may be decreased by e.g., plasma exposure, compared to the case where $R_1$ is another substituent.

However, if either one or both of $R_2$ and $R_4$ are aryl groups, it is acceptable that $R_1$ is a hydrogen atom. This is because the reactivity of $R_1$ being a hydrogen atom can be reduced by $R_2$ and $R_4$ being aryl groups.

A compound represented by general formula (11) may take the form of a salt. Examples of the salt include hydrochloride, isocyanuric acid salt, and triazineisocyanuric acid salt.

Specific examples of an amine compound represented by general formula (11) include the following compounds.

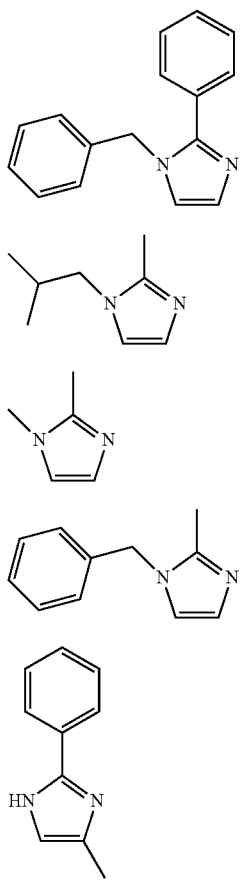

(11-1)
(11-2)
(11-3)
(11-4)
(11-5)

In general formula (12), $RA_1$, $RA_2$, $RA_3$ and $RA_4$ each independently represent a hydrogen atom, a $C_{1-17}$ aliphatic hydrocarbon group, an aryl-containing group, a hydroxy group or a dimethylaminomethyl group. The $C_{1-17}$ aliphatic hydrocarbon group is preferably a $C_{1-6}$ alkyl group. Examples of the aryl-containing group include an aryl group such as a phenyl group and a naphthyl group and an arylalkyl group such as a benzyl group. The number of carbon atoms constituting the aryl-containing group preferably falls within the range of 6 to 11.

However, in general formula (12), any one of $RA_1$, $RA_2$, $RA_3$ and $RA_4$ is a dimethylamino group. Preferably, two of $RA_2$, $RA_3$ and $RA_4$ are dimethylamino groups; more preferably, all of $RA_2$, $RA_3$ and $RA_4$ are dimethylamino groups. The dimethylaminomethyl group represented by $RA_1$, $RA_2$, $RA_3$ or $RA_4$ in general formula (2) has a moderate reactivity (nucleophilic reactivity). More specifically, when the methyl (Me) group of the dimethylaminomethyl group ($Me_2NCH_2$—) is substituted with a bulky alkyl group, reactivity decreases. For this reason, such a compound may not be suitable as a curing accelerator for the surface sealant of the present invention. Furthermore, if the dimethylaminomethyl group ($Me_2NCH_2$—) is substituted with a dimethylamino group ($Me_2N$—), reactivity excessively increases and storage stability decreases. Such a compound may not be suitable as a curing accelerator for the surface sealant of the present invention. The storage stability mentioned herein means that a curing reaction is less likely to proceed under storage conditions and viscosity does not easily increase.

The compound represented by general formula (12) may take the form of a salt. Examples of the salt include hydrochloride and 2-ethylhexanoate.

Specific examples of an amine compound represented by general formula (12) include the following compound.

(12-1)

To easily dissolve in e.g., epoxy resin (a) and arbitrary acid anhydride (c), the amine compound (b2) preferably has a close polarity to those.

The content of amine compound (b2) in a surface sealant is preferably 0.008:1 to 0.152:1 in terms of the equivalent ratio of an "active functional group (tertiary amino group) of the amine compound (b2)/an epoxy group contained in the surface sealant" and more preferably 0.02:1 to 0.15:1.

The amine compound (b2) may be constituted of one or two or more of the aforementioned compounds.

Acid Anhydride (c)

The surface sealant of the present invention may contain acid anhydride (c). Particularly, from a surface sealant containing an epoxy resin serving as a curing resin and an acid anhydride, a highly transparent cured material can be often obtained. Since aromatic acid anhydrides are mostly colored, an aliphatic (a hydrogenated aromatic) acid anhydride is preferable. Examples of the acid anhydride contained in a sealant include phthalic anhydride, tetrahydrophthalic anhydride, methyltetrahydrophthalic anhydride, trimellitic anhydride, hexachloroendomethylene tetrahydrophthalic anhydride and benzophenonetetracarboxylic anhydride. An aliphatic acid anhydride has high transparency. Hexahydrophthalic anhydride and methylhexahydrophthalic anhydride are used.

The surface sealant of the present invention preferably contains an acid anhydride (c) such that the equivalent ratio of "an acid anhydride group/an epoxy group" is 0.8:1 to 1.2:1. If the equivalent ratio is excessively low, viscosity stability may decreases under storage conditions such as room temperature. In contrast, when the equivalent ratio is excessively large, the amount of unreacted acid anhydride increases and e.g., water vapor permeability increases, which may cause deterioration of an organic EL element.

Coupling Agent (d)

The surface sealant of the present invention may contain a coupling agent such as a silane coupling agent, a titanium coupling agent, a zirconium coupling agent, or an aluminum coupling agent. The surface sealant containing a coupling agent exhibits good adhesion to a glass substrate.

Examples of the silane coupling agent include 1) a silane coupling agent having an epoxy group, 2) a silane coupling agent having a functional group reactive to an epoxy group and 3) other silane coupling agents. Of them, 1) a silane coupling agent having an epoxy group and 2) a silane coupling agent having a functional group reactive to an epoxy group are preferably used in order to leave no low-molecular weight component in a cured material by reacting with an epoxy resin of a sealing composition. The phrase "reacting with an epoxy resin" refers an addition reaction with an epoxy group, for example.

1) The silane coupling agent having an epoxy group refers to a silane coupling agent containing an epoxy group such as a glycidyl group. Examples thereof include γ-glycidoxypropyltrimethoxysilane and β-(3,4-epoxycyclohexyl)ethyltrimethoxysilane.

2) The functional group reactive to an epoxy group includes amino groups such as a primary amino group and a secondary amino group and a carboxyl group; and groups to be converted into a functional group reactive to an epoxy group (for example, a methacryloyl group, an isocyanate group). Examples of a silane coupling agent having a functional group reactive to an epoxy group include N-2-(aminoethyl)-3-aminopropylmethyldimethoxysilane, N-2-(aminoethyl)-3-aminopropylmethyltrimethoxysilane, N-2-(aminoethyl)-3-aminopropylmethyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane or 3-(4-methylpiperazino)propyltrimethoxysilane, trimethoxysilylbenzoic acid, γ-methacryloxypropyltrimethoxysilane and γ-isocyanatopropyltriethoxysilane.

Examples of 3) other silane coupling agents include vinyltriacetoxysilane and vinyltrimethoxysilane. These silane coupling agents may be used alone or in combination.

The molecular weight of a silane coupling agent contained in the surface sealant of the present invention is preferably 80 to 800. If the molecular weight of a silane coupling agent exceeds 800, adhesion may reduce.

The content of a silane coupling agent in the surface sealant of the present invention is preferably 0.05 to 30 parts by weight relative to the surface sealant (100 parts by weight), more preferably 0.1 to 20 parts by weight and further preferably 0.3 to parts by weight.

Other Optional Components (e)

Other optional components may be added to the surface sealant of the present invention as long as the effect of the present invention is not compromised. Examples of other optional components (e) include a resin component, a filler, a modifying agent, an antioxidant and a stabilizer. Specific examples of the resin component can include a polyamide, a polyamideimide, a polyurethane, a polybutadiene, a polychloroprene, a polyether, a polyester, a styrene-butadiene-styrene block co-polymer, a petroleum resin, a xylene resin, a ketone resin, a cellulose resin, a fluorine oligomer, a silicon oligomer and a polysulfide oligomer. These resin components can be used alone or in combination. However, if a cured material of the surface sealant of the present invention is required to be transparent, a component, which causes a phase separation from an epoxy resin and has a large refractive index difference with the epoxy resin; more specifically, e.g., an inorganic filler and an organic filler having a refractive index difference of 0.1 or more with an epoxy resin cured material and a diameter of 0.1 μm or more, are preferably not substantially contained.

Specific examples of the filler include glass beads, styrene polymer particles, methacrylate polymer particles, ethylene polymer particles and propylene polymer particles. These fillers can be used alone or in combination.

Specific examples of the modifying agent include a polymerization initiation promoter, an anti-degradation agent, a leveling agent, a wettability improver, a surfactant and a plasticizer. These modifying agents can be used alone or in combination. Furthermore, specific examples of the stabilizer include an UV absorber, an antiseptic agent and an antibacterial agent. These stabilizers are used alone or in combination.

The antioxidant refers to e.g., an agent such as a hindered amine light stabilizer (HALS) which inactivates radicals generated by plasma irradiation and sunlight irradiation and an agent which decomposes a peroxide. The antioxidant can prevent discoloration of a cured material of a sealant.

Examples of the hindered amine include bis(2,2,6,6-tetramethylpiperidin-4-yl)sebacate, a polycondensation product of 2,4-dichloro-6-tert-octylamino-s-triazine and 4,4'-hexamethylene bis(amino-2,2,6,6-tetramethylpiperidine) and bis[1-(2-hydroxy-2-methylpropoxy)-2,2,6,6-tetramethylpiperidin-4-yl]sebacate.

Examples of a phenol antioxidant include monophenols such as 2,6-di-t-butyl-p-cresol and bisphenols such as 2,2'-methylenebis(4-methyl-6-t-butylphenol) and polymer phenols such as 1,1,3-tris(2-methyl-4-hydroxy-5-t-butylphenyl)butane.

As a phosphorus antioxidant, an antioxidant selected from phosphites and a coloring inhibitor selected from oxaphosphaphenanthrene oxides are preferably used.

Particularly, in view of imparting resistance to UV rays, Tinuvin123 (bis(1-octyloxy-2,2,6,6-tetramethyl-4-piperidyl)sebacic acid), Tinuvin765 (a mixture of bis(1,2,2,6,6-pentamethyl-4-piperidyl)sebacic acid and methyl 1,2,2,6,6-pentamethyl-4-piperidyl sebacate), Hostavin PR25 (dimethyl 4-methoxybenzyl Idenemalonate), Tinuvin 312 or Hostavin vsu (ethanediamide N-(2-ethoxyphenyl)-N'-(2-ethylphenyl)) and CHIMASSORB 119 FL (N,N'-bis(3-aminopropyl)ethylene diamine-2,4-bis[N-butyl-N-(1,2,2,6,6-pentamethyl-4-piperidyl)amino]-6-chloro-1,3,5-triazine condensate are preferable.

Solvent (f)

The surface sealant of the present invention may contain solvent (f), Solvent (f) has a function of uniformly dispersing or dissolving individual components. Solvent (f) may be an organic solvent. Examples thereof include aromatic solvents such as toluene and xylene; ketone solvents such as acetone, methyl ethyl ketone and methyl isobutyl ketone; ethers such as ether, dibutyl ether, tetrahydrofuran, dioxane and ethylene glycol monoalkyl ether; aprotic polar solvents such as N-methyl pyrrolidone; and esters such as ethyl acetate and butyl acetate. Particularly, in the case where a molded article for surface sealing is obtained with an optional component i.e., high molecular weight epoxy resin (a-2) added in the surface sealant, to the surface sealant of the present invention, a ketone solvent (solvent having a keto group) such as methyl ethyl ketone is more preferable from the perspective of easily dissolving high molecular weight epoxy resin (a-2).

Viscosity of the surface sealant of the present invention measured at 25° C. and 1.0 rpm by E-type viscometer is preferably to 10000 mPa·s and more preferably 200 to 10000 mPa·s. If the viscosity of the surface sealant falls within the above range, coating property (for example, screen printing) thereof is improved and the surface sealant can be easily molded into a sheet. The viscosity of the surface sealant is measured by E-type viscometer (RC-500, manufactured by Toki Sangyo Co., Ltd.) at a measurement temperature of 25° C.

The viscosity increase rate of the surface sealant according to Embodiment 1 of the present invention after storage at 25° C. for 24 hr is preferably less than 100%, more preferably 70% or less and further preferably, 50% or less.

The above viscosity increase rate can be calculated as follows. More specifically, as described above, the viscosity of a surface sealant immediately after synthesis is measured by E-type viscometer at 25° C. and 1.0 rpm. Subsequently, the viscosity of the surface sealant stored at 25° C. for 24 hr is measured in the same conditions. The obtained measurement values are substituted into the following expression to calculate the viscosity increase rate.

Viscosity increase rate=viscosity change(viscosity after 24 hr−viscosity immediately after synthesis)/viscosity immediately after synthesis×100

The water content of the surface sealant of the present invention is preferably 0.1 mass % or less, and more preferably, 0.06 mass % or less. An electric circuit in which an optical semiconductor such as an organic EL element is arranged is easily degraded by moisture. Thus, it is preferable to reduce the water content of a surface sealant as much as possible. The water content of a surface sealant can be obtained by weighing about 10 g of a test sample, heating the test sample to 150° C., and measuring the amount of moisture generated by the Karl Fischer aquameter (solid-substance vaporization method).

The surface sealant of the present invention can be preferably used as a surface sealant for an optical semiconductor. The optical semiconductor is, for example, an element for emitting light by converting electricity into light. Specific examples of the optical semiconductor include an inorganic LED element and an organic EL element and preferably an organic EL element. Since the optical semiconductor is easily degraded by e.g., moisture, the surface thereof needs to be sealed.

The light transmittance of the surface sealant cured material of the present invention is preferably 30% or more, more preferably 50% or more and further preferably 80% or more. This is because if the light transmittance of a cured material is excessively low, if the cured material is used as a surface sealant for e.g., an organic EL element, the out-coupling efficiency from the element tends to decrease and furthermore, quality in view of design deteriorates. The upper-limit value of light transmittance of a cured material of the surface sealant can be generally about 99%. The light transmittance of the cured material can be controlled by the type and amount of amine compound (b) contained in a surface sealant.

The light transmittance of the cured material is measured by the following procedure.

1) A surface sealant is applied to a substrate, dried, cured to obtain a cured material having a thickness 100 μm.

2) The light transmittance of the obtained cured material at a wavelength of 450 nm is measured by an ultraviolet/visible light photometer (MULTISPEC-1500 manufactured by Shimadzu Corporation).

The surface sealant of the present invention may be used as a liquid sealant; however, it may be used as a part of a molded article for surface sealing such as a film by adding e.g., the aforementioned high molecular weight epoxy resin (a-2). If the sealant is used in the state of liquid, for example, it may be applied to an optical semiconductor such as an organic EL element by e.g., screen printing or dispenser coating, and the coating layer is cured to seal the surface of an optical semiconductor such as an organic EL element. Furthermore, if a molded article for surface sealing such as a film is used, the film sealant is laminated on an optical semiconductor such as an organic EL element and cured to seal the surface of the optical semiconductor such as an organic EL element.

The surface sealant of the present invention can be manufactured by any method as long as the effect of the present invention is not undermined and for example, manufactured by a method including a step 1) of preparing epoxy resin (a), curing accelerator (b) and other optional components, and a step 2) of mixing individual components under an inert gas environment at 30° C. or less. Examples of a mixing method include a method of stirring these components placed in a flask and a method of kneading them by three rolls. When the surface sealant of the present invention is molded into a film, for example, a liquid surface sealant may be applied to a delamination substrate, followed by drying and separation of the applied film. The surface sealant may be applied to a substrate by, for example, screen printing or dispenser coating.

The tertiary amine contained in the surface sealant according to Embodiment 1 of the present invention is capable of forming a complex with a metal ion with which an electron donating anionic ligand (preferably, a carboxylate compound) is coordinated and thus appropriately fixed as a metal complex. Thus, the tertiary amine is not easily removed from the metal complex under the conventional storage conditions for the surface sealant of the present invention, such as at room temperature and suppresses the reaction of e.g., an epoxy resin in the surface sealant. As a result, the storage stability of the surface sealant can be improved. On the other hand, when the surface sealant according to Embodiment 1 of the present invention is heated or irradiated with light for sealing an organic EL element as described later, the coordination bond between the tertiary amine and the metal ion is relaxed, the curing reaction of the tertiary amine with an epoxy resin is presumably carried out. The storage stability mentioned herein means that the curing reaction does not easily proceed under storage conditions and viscosity does not easily increase. As mentioned, the surface sealant according to Embodiment 1 of the present invention has good curability and high storage stability. Thus, when it is used as a surface sealant for an optical semiconductor, the working efficiency of a sealing step can be enhanced.

Furthermore, when the tertiary amine in metal complex (b1) is specified as any one of the compounds represented by the above general formulas (1) to (6), it is presumable that the reactivity of the tertiary amine can be reduced under storage conditions to the extent that curability is not impaired. Thus, as described later, it is conceivable that an increase in haze of the cured material layer when treated with plasma is limited, in other words, weather resistance can be improved.

Specific amine compound (b2) contained in the surface sealant according to Embodiment 2 of the present invention has a structure represented by the above general formula (11) or (12). Thus, the reactivity of amine compound (b2) can be presumably reduced to the extent that curability is not impaired under storage conditions. Accordingly, as described later, an increase in haze of the cured material layer due to plasma treatment is presumably reduced. Because of this, if the surface sealant of Embodiment 2 of the present invention is used as a surface sealant for an optical semiconductor, a reduction in the out-coupling efficiency or light absorption efficiency of an optical semiconductor caused by an increase in haze of the cured material layer after plasma treatment can be limited.

An example where an epoxy resin composition of the present invention is used as surface sealant has been explained. However, the epoxy resin composition of the present invention is not limited to this application and can be used in various applications.

2. Organic EL Device

The organic EL device of the present invention has an organic EL element arranged on a substrate, a resin cured material layer in contact with the organic EL element and covering the organic EL element (sealing the surface thereof) and a sealing board covering the resin cured material layer. The organic EL device can be used as an organic EL display panel having the organic EL device.

One configuration of the organic EL device of the present invention includes 1) an organic EL element arranged on a substrate, 2) a resin cured material layer in contact with the organic EL element and covering the organic EL element (sealing the surface thereof), 3) a passivation layer in contact with the resin cured material layer and covering the resin cured material layer, and 4) a sealing board covering the passivation layer (see FIG. 1A). Herein, the resin cured material layer is characterized by being the aforementioned a surface sealant cured material.

Figure 1B:
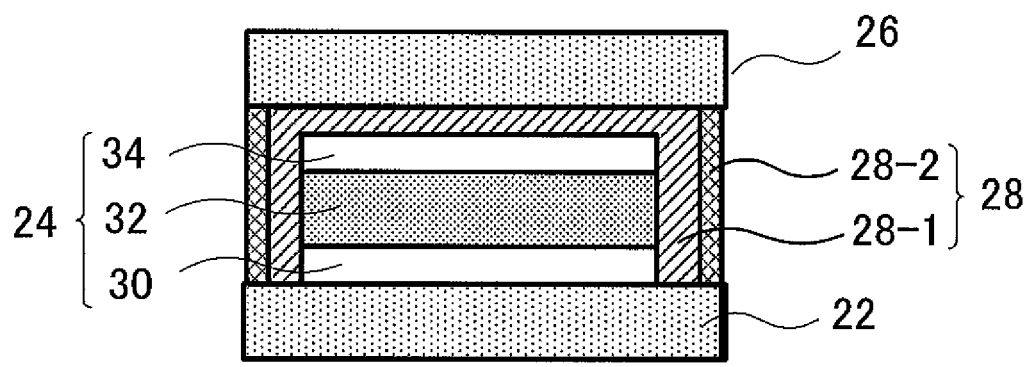

Another configuration of the organic EL device of the present invention includes 1) an organic EL element arranged on a substrate, 2) a resin cured material layer in contact with the organic EL element and covering the organic EL element (sealing the surface thereof), 3) a passivation layer in contact with the resin cured material layer and arranged on an edge surface of the resin cured material layer, and 4) a sealing board covering the resin cured material layer and the passivation layer (see FIG. 1B). Herein, the resin cured material layer is characterized by being the aforementioned cured material of the surface sealant.

FIG. 1A is a sectional view schematically showing a surface-sealed organic EL device. As shown in FIG. 1A, organic EL panel 20 is formed by laminating substrate 22, organic EL element 24 and sealing board 26 in this order. Between substrate 22 and sealing board 26, surface sealing layer 28 is arranged and surface sealing layer 28 covers over organic EL element 24. In this manner, surface sealing layer 28 seals the surface of organic EL element 24.

In organic EL device 20 shown in FIG. 1A, surface sealing layer 28 has cured material layer 28-1 formed of the cured material of the surface sealant of the present invention, passivation layer 28-2 covering cured material layer 28-1 and second resin cured material layer 28-3 covering passivation layer 28-2.

Substrate 22 and sealing board 26 each are usually formed of e.g., a glass substrate or a resin film, and at least one of substrate 22 and sealing board 26 is formed of a transparent glass substrate or a transparent resin film. Examples of such a transparent resin film include an aromatic polyester resin such as polyethylene terephthalate.

In the case of a top emission organic EL element, organic EL element 24 includes reflection pixel electrode layer 30 (formed of aluminum, silver or the like), organic EL layer 32 and transparent counter electrode layer 34 (formed of e.g., ITO or IZO) in the order from the side of substrate 22. Reflection pixel electrode layer 30, organic EL layer 32 and transparent counter electrode layer 34 may be formed by e.g., vacuum vapor deposition and sputter.

In surface sealing layer 28, cured material layer 28-1 formed of the cured material of the surface sealant of the present invention, passivation layer 28-2, and second resin cured material layer 28-3 are included. Cured material layer 28-1 is preferably in contact with the organic EL element. The thickness of cured material layer 28-1 is preferably 0.1 to 20 m.

When the surface sealant according to Embodiment 1 of the present invention is used, it is preferable that a spectrum of X-ray photoelectron spectroscopy (XPS) of the cured material layer 28-1 formed of the cured material of the surface sealant includes a peak derived from at least one metal atom selected from the group consisting of Zn, Bi, Ca, Al, Cd, La and Zr and a peak derived from a nitrogen atom, with the molar ratio of the metal atom to the nitrogen atom falling within the range of 1:0.5 to 1:6.0. The molar ratio of nitrogen atom to metal atom (1 mole) can vary depending upon the content of the tertiary amine relative to the metal ion in metal complex (b1). Furthermore, the metal atom is preferably Zn and the content thereof is preferably 0.5 to 15 mass % in the cured material.

XPS measurement can be performed by use of AXIS-NOVA (manufactured by KRATOS). As a light source, monochromatic A1 Kα can be used and the diameter of the measurement region can be set at 100 µm.

The light transmittance of cured material layer 28-1 formed of the cured material of the surface sealant of the present invention is preferably 30% or more, more preferably 50% or more and further preferably 80% or more, as mentioned above. If the light transmittance is excessively low, the out-coupling efficiency from the element and the absorption efficiency of light to the element tend to decrease. The upper limit of light transmittance of cured material layer 28-1 can be set, for example, at about 99%.

Passivation layer 28-2 constituting surface sealing layer 28 is preferably an inorganic compound layer to be formed under a plasma environment. The phrase "formed under a plasma environment", for example, means that a film is formed by plasma CVD but is not particularly limited to this. The layer may be formed by sputtering or vapor deposition. The material for passivation layer 28-2 is preferably a transparent inorganic compound. Examples of the inorganic compound include, but not particularly limited to, silicon nitride, silicon oxide, SiONF and SiON. The thickness of passivation layer 28-2 is preferably 0.1 to 5 µm.

Passivation layer 28-2 may be formed in contact with cured material layer 28-1. This is because cured material layer 28-1 formed of the cured material of the surface sealant of the present invention can maintain its transparency even if exposed to plasma.

In the organic EL device of the present invention, a film of passivation layer 28-2 is formed not in direct contact with organic EL element 24 but in direct contact with cured material layer 28-1. When passivation layer 28 is tried to be formed in direct contact with organic EL element 24, coverage of passivation layer 28 may reduce since organic EL element 24 has sharp edges. In contrast, in the organic EL device of the present invention, the surface of organic EL element 24 is sealed with cured material layer 28-1 of the surface sealant of the present invention and then passivation layer 28-2 is formed on cured material layer 28-1. Because of the surface-sealing with cured material layer 28-1, the surface of passivation layer 28-2 can be smoothed. In this manner, coverage is improved.

Second resin cured material layer 28-3 constituting surface sealing layer 28 may be made of the same material (as the surface sealant of the present invention) as used in cured material layer 28-1 or a different material. For example, the moisture content of second resin cured material layer 28-3 may be higher than that of cured material layer 28-1. This is because second resin cured material layer 28-3 is not in direct contact with the organic EL element. Furthermore, in the case of a top emission organic EL device (organic EL device in which light emitted from the organic EL element is out-coupled through sealing layer 28-3), the light transmissivity of second resin cured material layer 28-3 is required to be as high as that of resin cured material layer 28-1.

FIG. 1B is a schematic sectional view of another surface-sealed organic EL device. As shown in FIG. 1B, organic EL panel 20' is formed by laminating substrate 22, organic EL element 24 and sealing board 26 in this order. Between substrate 22 and sealing board 26, surface sealing layer 28 is arranged, which covers over organic EL element 24. In this manner, surface sealing layer 28 seals the surface of organic EL element 24.

In organic EL device 20' shown in FIG. 1B, surface sealing layer 28 includes cured material layer 28-1 formed of the cured material of the surface sealant of the present invention and passivation layer 28-2 covering the edge face of cured material layer 28-1. Other members consisting organic EL device 20' shown in FIG. 1B are the same as the members constituting organic EL device 20 shown in FIG. 1A.

The organic EL device of the present invention can be manufactured by any method as long as the effect of the present invention is not compromised; the manufacturing method includes a step 1) of preparing an organic EL element arranged on a substrate, a step 2) of covering the organic EL element with a surface sealant and curing the surface sealant to form a surface sealing layer and a step 3) of sealing with a sealing board. In this method, when a step of exposing the surface sealing layer to plasma is included, the effect of the surface sealant of the present invention is particularly efficiently exerted.

Examples of the step of exposing the surface sealing layer to plasma include a step of forming a passivation film on the surface sealing layer by plasma CVD and a step of changing surface characteristics of the surface sealing layer by irradiation of plasma. By changing surface characteristics (for example, by enhancing wettability), adhesion to other members can be improved. Particularly, the sealing layer formed of the surface sealant of Embodiment 2 of the present invention is excellent in plasma resistance. The surface sealing layer is less likely to deteriorate even if it is subjected to these steps and maintains, for example, high transparency.

Figure 2A:
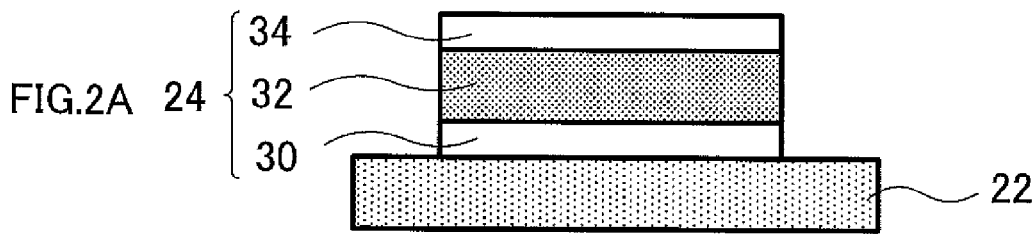
FIGS. 2A to 2E show a process for manufacturing a surface-sealed organic EL device.
Figure 2B:
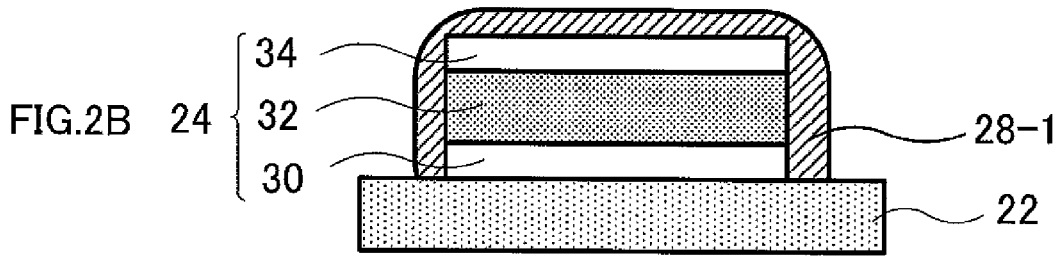

FIGS. 2A to 2E schematically show a process for manufacturing the organic EL device of the present invention. First, substrate 22 having organic EL element 24 thereon is provided (FIG. 2A). The organic EL element includes reflection pixel electrode layer 30, organic EL layer 32, and transparent counter electrode layer 34. Furthermore, other functional layers may be included in the organic EL element. Next, on organic EL element 24 laminated on substrate 22, a liquid surface sealant of the present invention is applied (so as to cover transparent counter electrode layer 34) or a surface sealant in the form of film is laminated, and thereafter cured to form cured material layer 28-1 (FIG. 2B).

Figure 2C:
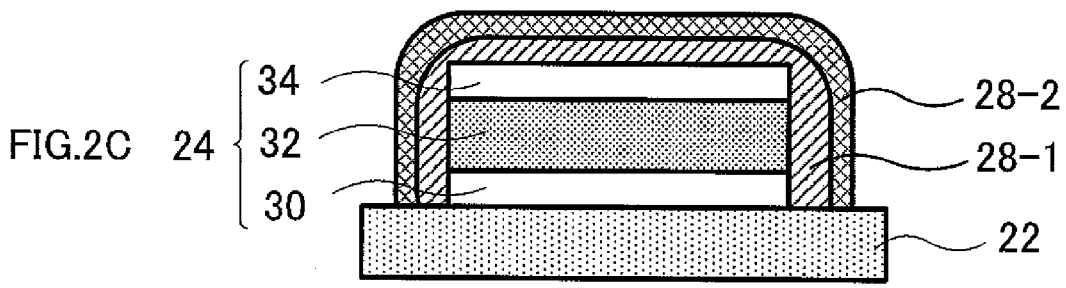
Figure 2D:
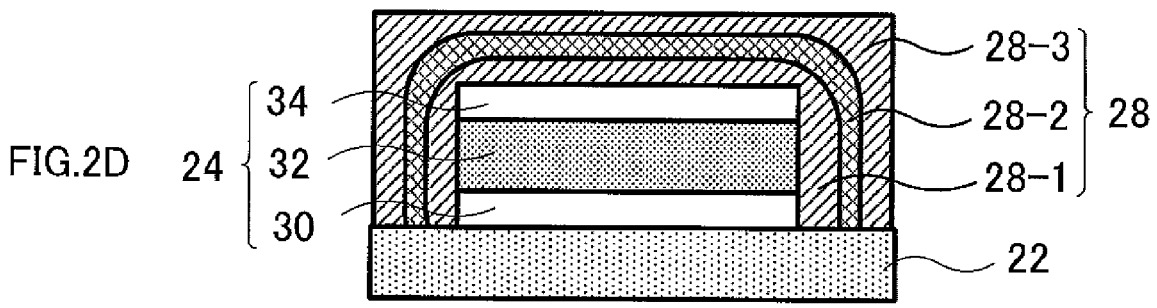

Next, on cured material layer 28-1, passivation layer 28-2 is formed (FIG. 2C). Passivation layer (transparent inorganic compound layer) 28-2 can be formed by any method, e.g., plasma CVD, sputtering or vapor deposition. When plasma CVD is selected for film deposition, the effect of the present invention is significantly exerted. To describe more specifically, when passivation layer 28-2 is formed by plasma CVD, transparency of cured material layer 28-1 is maintained although cured material layer 28-1 is significantly exposed to plasma compared to e.g., sputtering. As described, the surface sealant of the present invention can be particularly preferably used in a manufacturing process having the step of forming a passivation layer by a plasma CVD method.

Figure 2E:
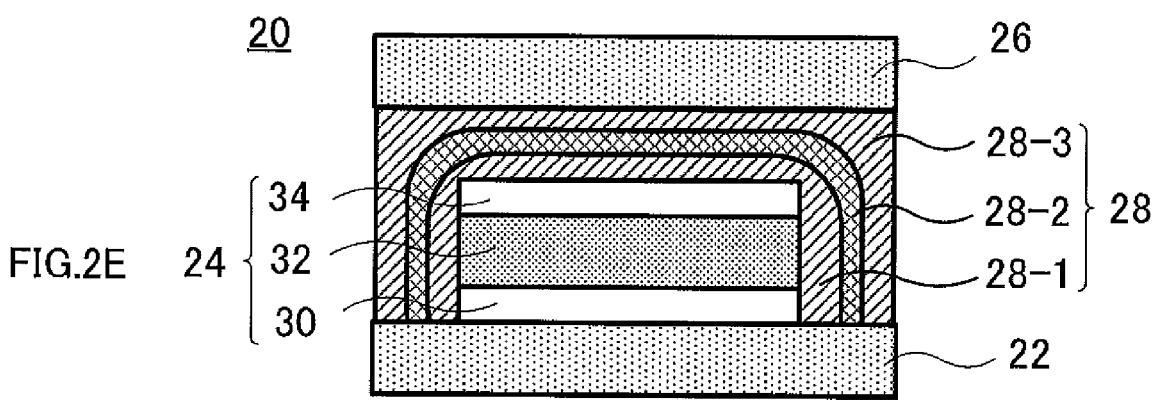

Next, passivation layer 28-2 is covered with a resin layer (FIG. 2D) and further, sealing board 26 is superposed. In this state, the resin layer is cured to form second resin cured material layer 28-3, and sealing board 26 is adhered (FIG. 2E). In this manner, organic EL device 20 of the present invention can be obtained.

FIGS. 2A to 2E show a flow diagram, starting with the formation of single organic EL element 24 on substrate 22 and ending with sealing of organic EL element 24. A plurality of organic EL elements 24 formed on substrate 22 can be sealed in the same procedure in a single process.

The surface sealant according to Embodiment 1 of the present invention is less likely to cause deterioration of an optical semiconductor such as an organic EL element. The reason for this is not clearly elucidated but presumed as follows. That is, when a tertiary amine in the surface sealant is easily movable, the tertiary amine interacts with a metal constituting the charge transport layer and light-emitting layer of an organic EL element and changes the state of the organic EL element. The element presumably deteriorates in this manner. In contrast, as the tertiary amine contained in the surface sealant according to Embodiment 1 of the present invention previously forms a complex with a metal ion, the structure around the tertiary amine is bulky. Therefore, the interaction between the tertiary amine and the charge transport layer and light-emitting layer of the organic EL element is less likely to occur. Deterioration of e.g., the organic EL element can be presumably limited in this manner.

Whether such deterioration of an element occurs or not can be evaluated by the following method. That is, an organic EL element is prepared by a vapor deposition method. On the element thus prepared, a surface sealant is applied and thermally cured to seal the element to obtain sample 1. On the other hand, the surroundings of the element prepared are similarly sealed with the surface sealant so as not to be in contact with the element (hollow sealing) to obtain sample 2. Sample 1 and sample 2 are subjected to measurement of initial light-emitting characteristics, life time and reliability and both samples are compared. When evaluation results of both samples do not differ from each other, it can be determined that the element is not degraded by interaction between the surface sealant and the element. Deterioration can be evaluated specifically by the same method as described in the deterioration test method in WO2010/035502.

EXAMPLES

1. Evaluation of Surface Sealant According to Embodiment 1

1-1. Synthesis of Metal Complex (b1)
Synthesis of Metal Complex (b1-0)

In accordance with the method for synthesizing a metal amidine complex described in WO2006/022899, metal complex (b1-0) was synthesized in which two molecules of 2-ethyl hexanoic acid serving as a carboxylate compound and two molecules of 1-methylimidazole serving as a tertiary amine were coordinated with one Zn ion serving as a core metal ion. In the obtained metal complex (b1-0), the molar ratio of the tertiary amine to the metal ion was 2.0:1. The results of $^1$H NMR, $^{13}$C NMR, FD MS analyses and C, H, N element analysis of metal complex (b1-0) are shown below. From these results, it is estimated that the structure of metal complex (b1-0) is represented by the above general formula (10).

$^1$H NMR (270 MHz, CDCl$_3$): δ 0.89 (t, J=7.6 Hz, 12H), 1.22-1.30 (m, 8H), 1.42-1.67 (m, 8H), 2.32 (td, J=6.9 Hz, 3.0 Hz, 2H), 3.69 (s, 6H), 6.84 (s, 2H), 7.37 (s, 2H), 8.15 (s, 2H).

$^{13}$C NMR (68 MHz, CDCl$_3$): δ 183.7, 139.9, 129.0, 120.0, 49.1, 32.6, 30.1, 26.1, 22.9, 14.1, 12.3.

FD MS m/z (relative intensity): 82.1 (60), 127.1 (30), 725.3 (100), 1427.6 (20).

Anal. Calcd for ZnC$_{24}$H$_{42}$N$_4$O$_4$: C, 55.9; H, 8.2; N, 10.9.
Synthesis of Metal Complex (b1-1)

To a 5 L flask, zinc bis(2-ethylhexoate)(768.19 g (2.18 mol)) was placed. To this, isopropyl alcohol (1500 g) was added and stirred under normal temperature/normal pressure at about 150 rpm. After complete dissolution of zinc bis(2- ethylhexoate) was confirmed, 1,2-DMZ (1,2-dimethylimidazole) (210 g (2.18 mol)) was added and continuously stirred. Subsequently, 1,2-DMZ (42 g (0.44 mol)) was further added and continuously stirred. Thereafter, stirring was terminated and the resultant solution was transferred to a 3 L flask. Evaporation was performed to distill away isopropyl alcohol to obtain liquid metal complex (b1-1). The molar ratio of tertiary amine to metal ion was 1.2:1.

$^1$HNMR of the obtained metal complex (b1-1) was measured.

$^1$H NMR (270 MHz, CDCl$_3$): δ 0.82 (t, J=6.8 Hz, 12H), 1.18-1.23 (m, 8H), 1.30-1.57 (m, 8H), 2.22 (td, J=6.9 Hz, 3.0 Hz, 2H), 2.51 (s, 3.7H), 3.57 (s, 3.7H), 6.76 (s, 1.2H), 7.06 (s, 1.2H).

Next, $^1$HNMR of 1,2-DMZ (1,2-dimethylimidazole) was measured.

$^1$HNMR (270 MHz, CDCl$_3$): δ 2.34 (s, 3H), 3.54 (s, 3H), 6.76 (s, 1H), 6.85 (s, 1H).

$^1$HNMR shift of metal complex (b1-1) and $^1$HNMR shift of 1,2-DMZ (1,2-dimethylimidazole) were compared. From this, a peak (6.85→7.06) ascribed to the 5-position hydrogen atom was presumably shifted. In the following formula, the position of the hydrogen atom for which chemical shift was confirmed is indicated by ○.

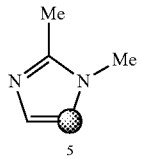

Synthesis of Metal Complex (b1-2)

Liquid-state metal complex (b1-2) was obtained in the same manner as in Synthesis Example 1 except that the tertiary amine was changed to 1B2MZ (1-benzyl-2-methylimidazole) and the charging amounts of zinc 2-ethylhexanoate and tertiary amine were changed such that the molar ratio of tertiary amine to metal ion was 0.8:1.

$^1$HNMR of the obtained metal complex (b1-2) was measured.

$^1$H NMR (270 MHz, CDCl$_3$, reference TMS): δ 0.83 (t, J=8.1 Hz, 12H), 1.19-1.28 (m, 8H), 1.34-1.61 (m, 8H), 2.22 (td, J=4.8 Hz, 1.9 Hz, 2H), 2.50 (s, 1.8H), 5.04 (s, 1.2H), 6.80 (d, J=1.6 Hz, 0.6H), 7.06-7.11 (m, 1.8H), 7.32-7.38 (m, 2.4H).

Next, $^1$HNMR of 1B2MZ (1-benzyl-2-methylimidazole) was measured.

$^1$H NMR (270 MHz, CDCl$_3$): δ 2.31 (s, 3H), 5.02 (s, 2H), 6.82 (d, J=0.68 Hz, 1H), 6.94 (d, J=0.68 Hz, 1H), 7.05 (dd, J=8.5 Hz, 0.8 Hz, 2H), 7.27-7.36 (m, 4H).

$^1$HNMR shift of the metal complex (b1-2) and $^1$HNMR shift of 1B2MZ (1-benzyl-2-methylimidazole) were compared. From this, a peak (2.31→2.50) ascribed to the hydrogen atom of the 2-position methyl group and a peak (6.94→7.06-7.11) ascribed to the 5-position hydrogen atom were presumably shifted. In the following formula, the position of the hydrogen atom for which chemical shift was confirmed is indicated by ○.

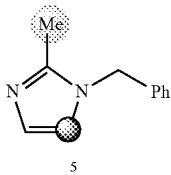

Synthesis of Metal Complex (b1-3)

Liquid-state metal complex (b1-3) was obtained in the same manner as in Synthesis Example 1 except that the tertiary amine was changed to 1BMI12 (1-isobutyl-2-methylimidazole) and the charging amounts of zinc bis(2-ethylhexoate) and tertiary amine were changed such that the molar ratio of tertiary amine to metal ion was 0.8:1.

$^1$HNMR of the obtained metal complex (b1-3) was measured.

$^1$H NMR (270 MHz, CDCl$_3$): δ 0.83 (t, J=7.0 Hz, 12H), 0.91 (t, J=4.1 Hz, 3H), 0.94 (d, J=6.5 Hz, 3H), 1.18-1.26 (m, 8H), 1.26-1.58 (m, 8H), 2.03 (qt, J=13.5, 0.5 Hz, 1H), 2.23 (td, J=4.8 Hz, 1.9 Hz, 2H), 2.50 (s, 3H), 3.63 (d, J=7.3 Hz, 2H), 6.74 (d, J=9.7 Hz, 1H), 7.10 (d, J=1.4 Hz, 1H).

Next, $^1$HNMR of 1BMI12 (1-isobutyl-2-methylimidazole) was measured.

$^1$H NMR (270 MHz, CDCl$_3$, reference TMS): δ 0.90 (t, J=4.1 Hz, 3H), 0.91 (d, J=6.5 Hz, 3H), 1.97 (qt, J=13.5, 0.5 Hz, 1H), 2.35 (s, 3H), 3.61 (d, J=7.3 Hz, 2H), 6.77 (d, J=1.4 Hz, 1H), 6.87 (d, J=1.4 Hz, 1H).

$^1$HNMR shift of metal complex (b1-3) and $^1$HNMR shift of 1BMI12 (1-isobutyl-2-methylimidazole) were compared. From this, a peak (2.35→2.50) ascribed to the hydrogen atom of the 2-position methyl group and a peak (6.87→7.10) ascribed to the 5-position hydrogen atom was presumably shifted. In the following formula, the position of the hydrogen atom for which chemical shift was confirmed is indicated by ○

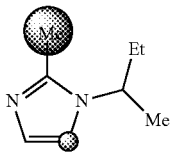

Synthesis of Metal Complex (b1-4)

Liquid-state metal complex (b1-4) was obtained in the same manner as in Synthesis Example 1 except that the tertiary amine was changed to 1MI (1-methylimidazole) and the charging amounts of zinc 2-ethylhexanoate and tertiary amine were changed such that the molar ratio of tertiary amine to metal ion was 2.0:1.

$^1$HNMR of the obtained metal complex (b1-4) was measured.

$^1$H NMR (270 MHz, CDCl$_3$): δ=0.89 (t, J=7.6 Hz, 12H), 1.22-1.30 (m, 8H), 1.42-1.67 (m, 8H), 2.32 (td, J=6.9 Hz, 3.0 Hz, 2H), 3.69 (s, 6H), 6.84 (s, 2H), 7.37 (s, 2H), 8.15 (s, 2H).

Next, $^1$HNMR of 1MI (1-methylimidazole) was measured.

$^1$H NMR (270 MHz, CDCl$_3$, reference TMS):δ=3.66 (s, 3H), 6.87 (s, 1H), 7.02 (s, 1H), 7.40 (s, 1H).

$^1$HNMR shift of metal complex (b1-4) and $^1$HNMR shift of 1MI (1-methylimidazole) were compared. From this, a peak (7.40→8.15) ascribed to the 2-position hydrogen atom and a peak (7.02→7.37) ascribed to the 4-position hydrogen atom was presumably shifted. In the following formula, the position of the hydrogen atom for which chemical shift was confirmed is indicated by ○.

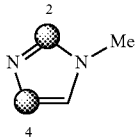

Synthesis of Metal Complex (b1-5)

Liquid-state metal complex (b1-5) was obtained in the same manner as in Synthesis Example 1 except that the tertiary amine was changed to 1B2PZ (1-benzyl-2-phenylimidazole) and the charging amounts of zinc 2-ethylhexanoate and tertiary amine were changed such that the molar ratio of tertiary amine to metal ion was 0.2:1.

$^1$HNMR of the obtained metal complex (b1-5) was measured.

$^1$H NMR (270 MHz, CDCl$_3$): δ 0.82 (t, J=7.8 Hz, 12H), 1.15-1.25 (m, 8H), 1.29-1.61 (m, 8H), 2.23 (td, J=8.4, 5.7 Hz, 2H), 5.14 (s, 0.4H), 7.01 (d, J=1.4 Hz, 0.2H), 7.07 (dd, J=6.5, 1.6 Hz, 0.4H), 7.27 (d, J=3.8 Hz, 0.2H), 7.33-7.45 (m, 1.2H), 7.58-7.61 (m, 2H).

Next, $^1$HNMR of 1B2PZ (1-benzyl-2-phenylimidazole) was measured.

$^1$H NMR (270 MHz, CDCl$_3$): δ=5.18 (s, 2H), 6.93 (d, J=3.2 Hz, 1H), 7.03 (dd, J=3.2, 1.4 Hz, 2H), 7.18 (d, J=3.8 Hz, 1H), 7.23-7.41 (m, 6H), 7.51-7.58 (m, 2H).

$^1$HNMR shift of the metal complex (b1-5) and $^1$HNMR shift of 1B2PZ (1-benzyl-2-phenylimidazole) were compared. From this, a peak (7.18→7.27) ascribed to the 5-position hydrogen atom, a peak ascribed to a hydrogen atom of a phenyl group (7.23-7.41→7.33-7.45) and a peak ascribed to a hydrogen atom of a phenyl group (7.51-7.58→7.58-7.61) were presumably moved. In the following formula, the position of the hydrogen atom for which chemical shift was confirmed is indicated by ○.

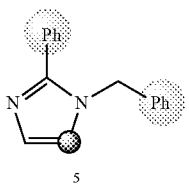

Synthesis of Metal Complex (b1-6)

Liquid-state metal complex (b1-6) was obtained in the same manner as in Synthesis Example 1 except that the tertiary amine was changed to DBU (1,8-diazabicyclo[5,4,0]undec-7-ene) and the charging amounts of zinc 2-ethylhexanoate and tertiary amine were changed such that the molar ratio of tertiary amine to metal ion was 1.0:1.

$^1$HNMR of the obtained metal complex (b1-6) was measured.

$^1$H NMR (270 MHz, CDCl$_3$): δ 0.85 (t, J=7.3 Hz, 12H), 1.19-1.27 (m, 8H), 1.29-1.67 (m, 14H), 1.82 (quin, J=5.9 Hz, 2H), 2.21 (td, J=8.1, 3.2 Hz, 2H), 2.63-2.65 (m, 2H), 3.21-3.41 (m, 6H).

Next, $^1$HNMR of DBU (1,8-diazabicyclo[5,4,0]undec-7-ene) was measured.

$^1$HNMR (270 MHz, CDCl$_3$, reference TMS): δ 1.58-1.68 (m, 6H), 1.78 (quin, J=6.2 Hz, 2H), 2.36-2.40 (m, 2H), 3.17-3.29 (m, 6H).

$^1$HNMR shift of the metal complex (b1-6) and $^1$HNMR shift of DBU (1,8-diazabicyclo[5,4,0]undec-7-ene) were compared. From this, a peak (3.17-3.29→3.21-3.41) ascribed to the 2, 9 and 11-position hydrogen atoms and a peak ascribed to the 6-position hydrogen atom (2.36-2.40→2.63-2.65) were presumably shifted. In the following formula, the position of the hydrogen atom for which chemical shift was confirmed is indicated by ○.

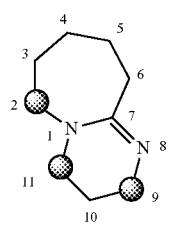

Synthesis of Metal Complex (b1-7)

Liquid-state metal complex (b1-7) was obtained in the same manner as in Synthesis Example 1 except that the tertiary amine was changed to DBN (1,5-diazobicyclo[4,3,0]non-5-ene) and the charging amounts of zinc 2-ethylhexanoate and tertiary amine were changed such that the molar ratio of tertiary amine to metal ion was 1.0:1.

$^1$HNMR of the obtained metal complex (b1-7) was measured.

$^1$H NMR (270 MHz, CDCl$_3$): δ 0.85 (t, J=6.8 Hz, 12H), 1.19-1.29 (m, 8H), 1.33-1.64 (m, 8H), 1.82 (quin, J=5.7 Hz, 2H), 1.94 (quin, J=7.8 Hz, 2H), 2.21 (td, J=8.1, 3.2 Hz, 2H), 2.81 (t, J=8.1 Hz, 2H), 3.19 (t, J=5.9 Hz, 2H), 3.33-3.41 (m, 4H).

Next, $^1$HNMR of DBN (1,5-diazobicyclo[4,3,0]non-5-ene) was measured.

$^1$H NMR (270 MHz, CDCl$_3$): δ 1.76 (quin, J=3.2 Hz, 2H), 1.89 (quin, J=3.0 Hz, 2H), 2.42 (t, J=8.1 Hz, 2H), 3.18 (t, J=5.9 Hz, 2H), 3.23-3.34 (m, 4H).

$^1$HNMR shift of metal complex (b1-7) and $^1$HNMR shift of DBN (1,5-diazobicyclo[4,3,0]non-5-ene) were compared. From this, a peak (2.42→2.81) ascribed to the 7-position hydrogen atom and a peak ascribed to the 4 and 9-position hydrogen atoms (3.23-3.34→3.33-3.41) were presumably shifted. In the following formula, the position of the hydrogen atom for which chemical shift was confirmed is indicated by ○.

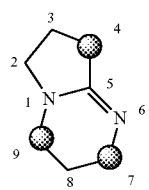

Compositions of the obtained metal complexes (b1-1) to (b1-7) and displacements of $^1$HNMR peak are collectively shown in Table 1. In the table, numerical values in the column of "metal complex" indicate mass ratios.

TABLE 1

|  |  |  | b1-1 | b1-2 | b1-3 | b1-4 | b1-5 | b1-6 | b1-7 |
|---|---|---|---|---|---|---|---|---|---|
| Metal complex | Metal ion/ anionic ligand | Zinc bis (2-ethylhexoate) (anion radius >3.3 Å) | 8.3 | 7.9 | 7.9 | 7.7 | 9.7 | 7.7 | 8.1 |
|  | Tertiary amine | 1,2-DMZ | 2.7 |  |  |  |  |  |  |
|  |  | 1B2MZ |  | 3.1 |  |  |  |  |  |
|  |  | IBMI12 |  |  | 3.1 |  |  |  |  |
|  |  | 1-MI |  |  |  | 3.3 |  |  |  |
|  |  | 1B2PZ |  |  |  |  | 1.3 |  |  |
|  |  | DBU |  |  |  |  |  | 3.3 |  |
|  |  | DBN |  |  |  |  |  |  | 2.9 |
|  |  | Molar ratio of tertiary amine to core metal | 1.20 | 0.80 | 0.80 | 2.0 | 0.2 | 1.0 | 1.0 |
| $^1$HNMR |  | Displacement of peak ascribed to 2-position hydrogen atom (ppm) | — | — | — | 0.75 | 0.09 | 0.08 | — |
|  |  | Displacement of peak ascribed to 2-position methyl group (ppm) | — | 0.19 | 0.15 | — | — | — | — |
|  |  | Displacement of peak ascribed to 2-position phenyl group (ppm) | — | — | — | — | 0.07 | — | — |
|  |  |  | — | — | — | — | 0.05 | — | — |
|  |  | Displacement of peak ascribed to 4-position hydrogen atom (ppm) | — | — | — | 0.35 | — | — | 0.085 |
|  |  | Displacement of peak ascribed to 5-position hydrogen atom (ppm) | 0.20 | 0.14 | 0.23 | — | — | — | — |
|  |  | Displacement of peak ascribed to 6-position hydrogen atom (ppm) | — | — | — | — | — | 0.26 | — |
|  |  | Displacement of peak ascribed to 7-position hydrogen atom (ppm) | — | — | — | — | — | — | 0.39 |
|  |  | Displacement of peak ascribed to another hydrogen atom (ppm) | — | — | — | — | — | 0.08 | 0.085 |

1-2. Evaluation of Surface Sealant

Surface sealant were prepared by using the following raw materials.

<Epoxy Resin (a)>
Trifunctional epoxy resin: molecular weight: 592 (VG-3101L, manufactured by Printec Co.)
Bisphenol F epoxy resin: molecular weight: 338 (YL-983U, manufactured by Japan Epoxy Resins Co., Ltd.)
Bisphenol E epoxy resin: epoxy equivalent: 155 to 175 (R1710, manufactured by Printec Co.)

<Metal Complex (b1)>
Metal complexes (b1-0) to (b1-1) synthesized above were used.

<Amine Compound (b2)>
1,2-Dimethylimidazole (Curezol 1.2DMZ, manufactured by Shikoku Chemicals Corporation)
1-Benzyl-2-methylimidazole (Curezol 1B2MZ, manufactured by Shikoku Chemicals Corporation)
1-Benzyl-2-phenylimidazole (Curezol 1B2PZ, manufactured by Shikoku Chemicals Corporation)
1-Isobutyl-2-methylimidazole (JER Cure IBMI12, manufactured by Japan Epoxy Resins Co., Ltd.)
2,4,6-Tris[(dimethyl amino)methyl]phenol (JER Cure 3010, manufactured by Japan Epoxy Resins Co., Ltd.)
Tris(dimethyl aminomethyl)phenol.tri(2-ethylhexoate) (K-61B, manufactured by Air Products Japan Inc.)
2-Phenyl-4-methylimidazole (Curezol 2P4MZ, manufactured by Shikoku Chemicals Corporation)

<Comparative Amine Compound>
2-Ethyl-4-methylimidazole (Curezol 2E4MZ, manufactured by Shikoku Chemicals Corporation)
Diazacyloundecene phthalate (SA-810, manufactured by SAN-APRO Limited)

<Acid Anhydride (c)>
A mixture of methylhexahydrophthalic anhydride and hexahydrophthalic anhydride (RIKACID MH-700, manufactured by New Japan Chemical Co., Ltd.)

Silane Coupling Agent (d)>
3-Glycidoxypropyltrimethoxysilane, molecular weight: 236 (KBM-403, manufactured by Shin-Etsu Chemical Co., Ltd.)

Examples 1 to 10 and Comparative Example 1

In a flask purged with nitrogen, an epoxy resin (100 parts by weight) having a composition shown in Table 2, an acid anhydride (84 parts by weight), a silane coupling agent (4 parts by weight) and a metal complex (b1-0) or a comparative amine compound (parts by weight shown in Table 2) were mixed while stirring to obtain a surface sealant.

The viscosity of each of the surface sealants obtained in Examples 1 to 10 and Comparative Example 1 was measured. The viscosity (0 h) of the surface sealant immediately after synthesis and the viscosity of the surface sealant, stored at 25° C. for 24 hours or 48 hours after synthesis, were separately measured by E-type viscometer (digital rheometer Model DII-III ULTRA manufactured by BROOKFIEL) at 25° C. and 1 rpm. Then, the measured values were substituted in the following equation to obtain a viscosity increase rate.

Increase rate(%)=(Δviscosity change(viscosity after 24 hr or 48 hr−viscosity immediately after synthesis)/viscosity immediately after synthesis)×100

A surface sealant having a viscosity increase rate (from the viscosity immediately after synthesis to the viscosity after storage at 25° C. for 24 hours) of 50% or less was evaluated as ◯, more than 50% and less than 100% as Δ, and more than 100% as x. Furthermore, a surface sealant having a viscosity increase rate (from the viscosity immediately after synthesis to the viscosity after storage at 25° C. for 48 hours) of 100% or less was evaluated as ◯, more than 100% and less than 200% as Δ, and more than 200% as x. The measurement results are shown in Table 2.

The curability of each of the surface sealants obtained in Examples 1 to 10 and Comparative Example 1 was evaluated by the following method. Each surface sealant was thermally cured in air for 30 minutes. The flowability and tackiness of the cured material were evaluated by use of pencil hardness. A cured material neither flowable nor tacky was evaluated as ◯, a cured material flowable as x, and a cured material still tacky as Δ.

Furthermore, the water content of the obtained surface sealant was measured by the Karl Fischer's method. As a result, the water contents of the surface sealants of Examples 1 to 10 and Comparative Example 1 were all not greater than 0.1 wt %.

Preparation of Cured Material Layer

The surface sealants obtained in Examples 1 to 10 and Comparative Example 1 were each printed by a screen printer (Screen Printer Model 2200, manufactured by MITANI) to a glass substrate (7 cm×7 cm×0.7 mm-thickness) previously washed by ozone treatment. The surface sealant was applied such that a dry-state coating of 5 cm×5 cm×3 μm-thickness was obtained. The printed glass substrate was heated on a hot plate heated to 100° C. for 30 minutes to obtain a cured material layer.

The haze value (%) of the cured material layer was measured by a haze meter (model TC-H3DPK, manufactured by Tokyo Denshoku Co., Ltd.). Thereafter, the glass substrate having the cured material layer formed thereon was set in a plasma treatment apparatus (model PDC210, parallel flat-plate type, manufactured by Yamato Scientific Co., Ltd.) and plasma treatment was carried out at an oxygen flow rate of 20 mL/minute and an RF power of 500 W for 20 minutes. Then, the haze value (%) of the cured material layer after the plasma treatment was measured by use of a haze meter (model TC-H3DPK, manufactured by Tokyo Denshoku Co., Ltd.). The haze measurement values are shown in Table 2.

A cured material layer after plasma irradiation having a haze of 10% or less was evaluated as ○, more than 10% to 30% or less as Δ, and more than 30% as x.

As mentioned above, by treating a cured material of the surface sealant with plasma and evaluating a change in haze, whether a surface sealant is suitable for a method for manufacturing an organic EL device including a step of irradiating plasma to a cured material of the surface sealant, can be evaluated; at the same time, accelerated evaluation of weather resistance can be made.

The evaluation results of the surface sealants of Examples 1 to 10 and Comparative Example 1 are shown in Table 2.

TABLE 2

| | | | Example 1 | Example 2 | Example 3 | Example 4 | Example 5 | Example 6 |
|---|---|---|---|---|---|---|---|---|
| Composition | Epoxy resin | YL-983U | 40 | 40 | | | | |
| | | VG-3101L | 60 | 60 | 60 | 60 | 71 | 71 |
| | | R1710 | | | 40 | 40 | 29 | 29 |
| | Acid anhydride | MH700 | 84 | 84 | 86 | 86 | 84 | 84 |
| | Amine compound | 1B2PZ | | | | | | |
| | | 1B2MZ | | | | | | |
| | | 2E4MZ | | | | | | |
| | Metal complex | Metal complex (b1-0) | 6.0 | 15 | 6.0 | 10 | 6.0 | 10 |
| | Silane coupling agent | KBM | 4.0 | 4.0 | 4.0 | 4.0 | 4.0 | 4.0 |
| | Equivalent ratio of tertiary amine to epoxy group | | 0.0508 | 0.127 | 0.0508 | 0.127 | 0.0547 | 0.0912 |
| Evaluation | Plasma resistance | Haze (before plasma irradiation) | 2.6 | 0 | 1.7 | 0.8 | 0.2 | 0.1 |
| | | Haze (after plasma irradiation) | 2.6 | 0.7 | 0.5 | 0.3 | 0.5 | 0.2 |
| | | Evaluation | ○ | ○ | ○ | ○ | ○ | ○ |
| | Storage stability | Viscosity at 0 hr (mPa·s) | 3412 | 3767 | 1889 | 2134 | 4623 | 5099 |
| | | Viscosity at 24 hr (mPa·s) | 4373 | 5480 | | | | |
| | | Viscosity at 48 hr (mPa·s) | | | 2876 | 3330 | 7210 | 8970 |
| | | Increase rate (%) | 28 | 45 | 52 | 56 | 56 | 76 |
| | | Evaluation | ○ | ○ | ○ | ○ | ○ | ○ |
| | Curability | | Δ | ○ | Δ | Δ | ○ | ○ |

| | | | Example 7 | Example 8 | Example 9 | Example 10 | Comparative Example 1 |
|---|---|---|---|---|---|---|---|
| Composition | Epoxy resin | YL-983U | | | 40 | 40 | 40 |
| | | VG-3101L | 71 | 65 | 60 | 60 | 60 |
| | | R1710 | 29 | 35 | | | |
| | Acid anhydride | MH700 | 84 | 84 | 84 | 84 | 84 |
| | Amine compound | 1B2PZ | | | 3.0 | | |
| | | 1B2MZ | | | | 3.0 | |
| | | 2E4MZ | | | | | 3.0 |
| | Metal complex | Metal complex (b1-0) | 15 | 10 | | | |
| | Silane coupling agent | KBM | 4.0 | 4.0 | 4.0 | 4.0 | 4.0 |
| | Equivalent ratio of tertiary amine to epoxy group | | 0.137 | 0.0875 | 0.0559 | 0.0761 | 0.119 |
| Evaluation | Plasma resistance | Haze (before plasma irradiation) | 0 | 0.1 | 0 | 0 | 0 |
| | | Haze (after plasma irradiation) | 20.6 | 5.1 | 12.8 | 14.7 | 45.1 |
| | | Evaluation | Δ | ○ | Δ | Δ | x |
| | Storage stability | Viscosity at 0 hr (mPa·s) | 5490 | 2508 | 3873 | 5380 | 7200 |
| | | Viscosity at 24 hr (mPa·s) | 7130 | | 7200 | 13800 | 26290 |
| | | Viscosity at 48 hr (mPa·s) | | 4316 | | | |
| | | Increase rate (%) | 30 | 72 | 86 | 157 | 265 |
| | | Evaluation | ○ | ○ | Δ | x | x |
| | Curability | | ○ | ○ | ○ | ○ | ○ |

For every surface sealant prepared in Examples and Comparative Example, the haze of a cured material layer before plasma treatment is sufficiently reduced. In the surface sealants of Examples 1 to 10, haze values of the cured material layers after plasma treatment are reduced to less than 30%; whereas in the surface sealant of Comparative Example 1, the haze value of a cured material layer after plasma treatment exceeds 40%.

In addition, it is found that the surface sealant of Comparative Example 1 has good curability but poor storage stability; whereas, the surface sealants of Examples 1 to 8 have high curability and good storage stability. It is found that particularly surface sealants of Examples 2, 5 to 8 exhibited a low viscosity increase rate even after storage for 48 hours and have good curability.

Examples 11 to 23 and 25, Comparative Example 2

In a flask purged with nitrogen, an epoxy resin (100 parts by weight) having a composition shown in Tables 3 to 5, an acid anhydride (84 parts by weight), a silane coupling agent (4 parts by weight) and a metal complex or an amine compound (parts by weight shown in Tables 3 to 5) were mixed while stirring to obtain a surface sealant. Note that, the metal complexes used in Examples 11 to 13 were metal complexes (b1-1) to (b1-3) synthesized above.

Example 24

A surface sealant was obtained in the same manner as in Example 11 except that zinc bis(2-ethylhexoate) and 1,2-DMZ were independently added in place of the metal complex.

The viscosity of each of the surface sealants obtained in Examples 11 to 25 and Comparative Example 2 was measured in the same manner as above. Furthermore, stabilization degree by complexation was calculated as follows. That is, the viscosity increase rate (after 24 hr) of a surface sealant containing a tertiary amine and zinc bis(2-ethylhexoate) in discrete forms (i.e., increase rate in the case of non-complexation) was divided by the viscosity increase rate (after 24 hr) of a surface sealant containing a metal complex of a tertiary amine and zinc bis(2-ethylhexoate) to obtain a value of "stabilization degree by complexation". When the stabilization degree due to complexation is larger than 1, it means that the stability is enhanced by complexation. When the stabilization degree is smaller than 1, it means that stability is reduced by complexation.

Note that, in Tables 3 to 5 described later, as "the increase rate in non-complexation case", the increase rate after 24 hr of Example 24 was used when a tertiary amine was "1,2-DMZ"; the increase rate after 24 hr of Example 25 was used when a tertiary amine was "IBMI12"; and the increase rate after 24 hr of Example 10 was used when a tertiary amine was "1B2MZ".

The curability of each of the surface sealants obtained in Examples 11 to 25 and Comparative Example 2 was evaluated in the same manner as above.

Preparation of Cured Material Layer

The surface sealants obtained in Examples 11 to 23 and Comparative Example 2 were each printed by a screen printer (Screen Printer Model 2200, manufactured by MITANI) to a glass substrate (7 cm×7 cm×0.7 mm-thickness) previously washed by ozone treatment. The surface sealant was applied such that a dry-state coating of 5 cm×5 cm×3 μm-thickness was obtained. The glass substrate to which the surface sealant was printed was heated on a hot plate heated to 100° C. for 30 minutes to obtain a cured material layer.

The haze value (%) of the cured material layer was measured by a haze meter (model TC-H3DPK, manufactured by Tokyo Denshoku Co., Ltd.). Thereafter, the glass substrate having a cured material layer formed thereon was set in a sputter thin-film forming apparatus (JSP-8000 manufactured by ULVAC, Inc.) to form a $SiO_2$ film of 50 nm in thickness in the following conditions. Then, after completion of film-formation treatment, the haze value (%) of the cured material layer was measured by a haze meter (model TC-H3DPK, manufactured by Tokyo Denshoku Co., Ltd.).

<Pre-Sputtering Conditions>
Target: $SiO_2$
Type of gas: Ar
Gas flow rate: 15 sccm
Pressure: $4.8 \times 10^{-1}$ Pa
Power supply: Alternating current power supply (frequency 13.56 MHz)
Input electric power: 300 W
Time: 120 seconds
Temperature: Room temperature <Film-Formation Conditions>
Target: $SiO_2$
Type of gas: Ar
Gas flow rate: 15 sccm
Pressure: $4.8 \times 10^{-1}$ Pa
Power supply: Alternating current power supply (frequency 13.56 MHz)
Input electric power: 300 W
Time: 2500 seconds
Temperature: Room temperature A cured material layer after film formation treatment having a haze of 25% or less was evaluated as ○, more than 25% to 40% or less as Δ, and more than 40% as x.

A low haze value obtained after film formation treatment by sputtering means that the surface of the cured material layer after film formation treatment is smooth (external haze is low), since the cured material layer has a relatively high degree of curing, in particular at the surface thereof. In contrast, a high haze value obtained after film formation treatment by sputtering means that the surface of the cured material layer is roughened (external haze is high) by the film formation treatment, since the cured material layer has a relatively low degree of curing, in particular at the surface thereof. Note that high haze values obtained after film formation treatment by sputtering do not necessarily mean that the weather resistance of the cured material of the surface sealant is low.

The measurement results of Examples 11 to 16 are shown in Table 3; the measurement results of Examples 17 to 21 are shown in Table 4; and the measurement results of Example 22 to 25 and Comparative Example 2 are shown in Table 5. In the tables, the "anion diameter" in a metal complex refers to the radius of an anionic ligand. The radius of an anionic ligand was computationally found by obtaining the Connolly volume by use of Material Studio 6.0 Dmol, and measuring the radius of a true sphere while assuming that the Connolly volume is equal to the volume of the true sphere. On the other hand, as the radiuses of a chloride ion and a sulfuric acid ion, ion radiuses (Calculation values by Shannon and Prewitt) described in Chemical handbook, basic version, revised second edition, edited by the Chemical Society of Japan) were used.

TABLE 3

|  |  |  | Example 11 | Example 12 | Example 13 | Example 14 | Example 15 | Example 16 |
|---|---|---|---|---|---|---|---|---|
| Composition | Epoxy resin | YL-983U | 40 | 40 | 40 | 40 | 40 | 40 |
|  |  | VG-3101L | 60 | 60 | 60 | 60 | 60 | 60 |
|  | Acid anhydride | MH700 | 84 | 84 | 84 | 84 | 84 | 84 |

TABLE 3-continued

|  |  |  |  | Example 11 | Example 12 | Example 13 | Example 14 | Example 15 | Example 16 |
|---|---|---|---|---|---|---|---|---|---|
|  | Metal complex | Metal ion/ anionic ligand | Anion diameter |  |  |  |  |  |  |
|  |  | Zinc bis (2-ethylhexoate) | >3.3 Å | 8.3 | 7.9 | 7.9 | 7.5 | 7.2 | 6.7 |
|  |  | Zinc chloride | 1.67 Å |  |  |  |  |  |  |
|  |  | Zinc benzoate | >3.3 Å |  |  |  |  |  |  |
|  |  | Zinc acetylacetonate | >3.3 Å |  |  |  |  |  |  |
|  |  | Zinc sulfate | 3.4 Å |  |  |  |  |  |  |
|  | Tertiary amine | 1,2-DMZ |  | 2.7 |  |  |  |  |  |
|  |  | 1B2MZ |  |  | 3.1 |  |  |  |  |
|  |  | IBMI12 |  |  |  | 3.1 | 3.5 | 3.8 | 4.3 |
|  | Molar ratio of tertiary amine to metal ion |  |  | 1.20 | 0.80 | 0.80 | 1.20 | 1.40 | 1.60 |
|  | Silane coupling agent | KBM |  | 4 | 4 | 4 | 4 | 4 | 4 |
|  | Equivalent ratio of tertiary amine active functional group to epoxy group |  |  | 0.0539 | 0.0345 | 0.0431 | 0.0486 | 0.0528 | 0.0597 |
| Evaluation | Haze change after film-formation treatment (surface shape change) | Haze (before sputtering) |  | 0 | 0 | 0 | 0 | 0 | 0 |
|  |  | Haze (after sputtering) |  | 0.1 | 21.0 | 1.0 | 1.5 | 0.2 | 0.2 |
|  |  | Evaluation |  | ○ | ○ | ○ | ○ | ○ | ○ |
|  | Storage stability | 0 hr/mPa·s |  | 3473 | 3193 | 3313 | 3257 | 2952 | 2982 |
|  |  | 24 hr/mPa·s |  | 6370 | 4213 | 4486 | 5130 | 5650 | 5750 |
|  |  | 48 hr/mPa·s |  | 10770 | 4990 | Not measured | Not measured | 12810 | 13480 |
|  |  | Increase rate (%) 24 hr |  | 83 | 32 | 35 | 58 | 91 | 93 |
|  |  | Increase rate in non-complexation case 24 hr (%) |  | 128 | 157 | 4738 more | 4738 more | 4738 more | 4738 more |
|  |  | Stabilization degree by complexation |  | 1.5 | 4.9 | 135 more | 81 more | 52 more | 51 more |
|  |  | Curability |  | 89 | 88 | 87 | 87 | 89 | 92 |

TABLE 4

|  |  |  |  | Example 17 | Example 18 | Example 19 | Example 20 | Example 21 |
|---|---|---|---|---|---|---|---|---|
| Composition | Epoxy resin | YL-983U |  | 40 | 40 | 40 | 40 | 40 |
|  |  | VG-3101L |  | 60 | 60 | 60 | 60 | 60 |
|  | Acid anhydride | MH700 |  | 84 | 84 | 84 | 84 | 84 |
|  | Metal complex | Metal ion/ anionic ligand | Anion diameter |  |  |  |  |  |
|  |  | Zinc bis(2-ethylhexoate) | >3.3 Å |  |  |  |  |  |
|  |  | Zinc chloride | 1.67 Å | 6.1 |  |  |  |  |
|  |  | Zinc benzoate | >3.3 Å |  |  | 8.0 |  |  |
|  |  | Zinc acetylacetonate | >3.3 Å |  |  |  | 7.7 |  |
|  |  | Zinc sulfate | 3.4 Å |  |  |  |  | 6.4 |
|  | Tertiary amine | 1,2-DMZ |  | 4.9 | 4.3 | 3.0 | 3.3 | 4.6 |
|  |  | 1B2MZ |  |  |  |  |  |  |
|  |  | IBMI12 |  |  |  |  |  |  |
|  | Molar ratio of tertiary amine to metal ion |  |  | 1.2 | 1.2 | 1.2 | 1.2 | 1.2 |
|  | Silane coupling agent | KBM |  | 4 | 4 | 4 | 4 | 4 |
|  | Equivalent ratio of tertiary amine active functional group to epoxy group |  |  | 0.0978 | 0.0859 | 0.0599 | 0.0659 | 0.0918 |
| Evaluation | Haze change after film-formation treatment (surface shape change) | Haze (before sputtering) |  | 0 | 0 | 0 | 0 | 0 |
|  |  | Haze (after sputtering) |  | 27.4 | 0.6 | 0.2 | 0.3 | 77.6 |
|  |  | Evaluation |  | Δ | ○ | ○ | ○ | x |
|  | Storage stability | 0 hr/mPa·s |  | 2455 | 4053 | 4651 | 3427 | 2728 |
|  |  | 24 hr/mPa·s |  | 2999 | 8690 | 6410 | 4486 | 3179 |
|  |  | Increase rate (%) 24 hr |  | 22 | 114 | 38 | 31 | 17 |
|  |  | Increase rate in non-complexation case 24 hr (%) |  | 128 | 128 | 128 | 128 | 128 |
|  |  | Stabilization degree by complexation |  | 5.8 | 1.1 | 3.4 | 4.1 | 7.7 |
|  |  | Curability |  | 89 | 89 | 90 | 88 | 86 |

TABLE 5

|  |  |  | Example 22 | Example 23 | Example 24 | Example 25 | Comparative Example 2 |
|---|---|---|---|---|---|---|---|
| Composition | Epoxy resin | YL-983U | 40 | 40 | 40 | 40 | 40 |
|  |  | VG-3101L | 60 | 60 | 60 | 60 | 60 |
|  | Acid anhydride | MH700 | 84 | 84 | 84 | 84 | 84 |

TABLE 5-continued

|  |  |  |  | Example 22 | Example 23 | Example 24 | Example 25 | Comparative Example 2 |
|---|---|---|---|---|---|---|---|---|
| Metal complex | Metal ion/ anionic ligand | Zinc bis(2-ethylhexoate) | Anion diameter >3.3 Å | 8.5 | 7.3 | 8.0 |  | 11 |
|  |  | Zinc chloride | 1.67 Å |  |  |  |  |  |
|  |  | Zinc benzoate | >3.3 Å |  |  |  |  |  |
|  |  | Zinc acetylacetonate | >3.3 Å |  |  |  |  |  |
|  |  | Zinc sulfate | 3.4 Å |  |  |  |  |  |
|  | Tertiary amine |  | 1-MI | 2.0 | 1.7 |  |  |  |
|  |  |  | 1,2 DMZ | 0.5 |  | 2.0 |  |  |
|  |  |  | 1B2PZ |  | 2.0 |  |  |  |
|  |  |  | IBMI12 |  |  |  | 3.5 |  |
|  | Molar ratio of tertiary amine to metal ion |  |  | 1.20 | 1.40 |  |  | — |
|  | Silane coupling agent |  | KBM | 4 | 4 |  |  | 4 |
|  | Equivalent ratio of tertiary amine active functional group to epoxy group |  |  | 0.129 | 0.128 |  |  |  |
| Evaluation | Haze change after film-formation (surface shape change) | Haze (before sputtering) |  | 0 | 0 | — |  | nd |
|  |  | Haze (after sputtering) |  | 0.4 | 28.0 | — |  | nd |
|  |  | Evaluation |  | ○ | Δ | — |  | nd |
|  | Storage stability | 0 hr/mPa·s |  | 2830 | 2555 | 3245 | 4134 | nd |
|  |  | 24 hr/mPa·s |  | 3787 | 4289 | 7400 | 200000 more | nd |
|  |  | Increase rate (%) 24 hr |  | 34 | 68 | 128 | 4738 more | nd |
|  |  | Increase rate in non-complexation case 24 hr (%) |  | 128 | 86 | — | — | — |
|  |  | Stabilization degree by complexation |  | 3.8 | 1.3 | — | — | — |
|  |  | Curability |  | 87 | 86 | 91 | 93 | 70 |

As shown in Tables 3 to 5, the surface sealants of Examples 11 to 23 exhibit good curability and a stabilization degree by complexation of larger than 1. The surface sealants are found to have high storage stability. More specifically, the surface sealant of Example 25 in which a pure form (i.e., non-complexed) of tertiary amine was added, and the surface sealant of Example 24 in which a tertiary amine and zinc bis(2-ethylhexoate) are added separately (i.e., a complex is not formed) show a slightly higher viscosity increase rate after 24 hr; whereas the surface sealants of Examples 11 and 12 and 17 to 23 show a low viscosity increase rate after 24 hr. From this, it is shown that the storage stability of a surface sealant is improved by complexation of a tertiary amine. In contrast, the surface sealant of Comparative Example 2 containing no tertiary amine has low curability. Evaluation of the cured material was not performed.

Of them, the cured materials of surface sealants of Examples 11 to 16 and 18 to 20 have low haze after film formation treatment. From this, it is found that good transparency was maintained. This is considered that since the surface curability of each of the cured materials of surface sealants of Examples 11 to 16 and 18 to 20 is high, an increase of external haze, which is caused by roughening the film surface, can be reduced.

2. Evaluation of Surface Sealant According to Embodiment 2

Examples 26 to 34, Comparative Examples 3 and 4

In a flask purged with nitrogen, an epoxy resin (100 parts by weight) having a composition shown in Table 6, an acid anhydride (85 parts by weight), a silane coupling agent (4 parts by weight) and an amine compound (parts by weight shown in Table 6) were mixed while stirring to obtain a surface sealant.

The viscosity of each of the surface sealants obtained in Examples 26 to 34 and Comparative Example 3 and 4 was measured by E-type viscometer (digital rheometer model DII-III ULTRA, manufactured by BROOKFIELD) at 25° C. The measurement results are shown in Table 6.

The curability of each of the surface sealants obtained in Examples 26 to 34 and Comparative Example 3 and 4 was evaluated by the following method. Each surface sealant was sandwiched between two NaCl crystal plates (thickness: 5 mm) to prepare a sample. Between the 2 NaCl crystal plates (2 cm squares), the surface sealant was injected so as to obtain an interval between the NaCl crystal plates of 15 μm. This sample was treated with heat at 100° C. for 30 minutes and irradiated with infrared ray. Before and after the heat treatment, an infrared transmission spectrum was measured by a FT-IR spectrometer. Based on the obtained spectra, the height of the absorption peak (near 910 cm$^{-1}$) derived from asymmetric ring stretching vibration of an epoxy group was divided by the height of the absorption peak (near 1600 cm$^{-1}$) derived from endocyclic C—C stretching vibration of an benzene ring and then standardized. Then, based on the degree of reduction of the peak derived from an epoxy group by the heat treatment, the ratio of the reacted epoxy groups was calculated.

Assuming that the standardized value of the epoxy-group peak (before the heat treatment) was represented by x1; and the standardized value of the epoxy group peak (after the heat treatment) by x2, a value calculated in accordance with the equation $\{(x1-x2)/x1\}\times 100(\%)$ was defined as the epoxy conversion rate. When the epoxy conversion rate is 80% or more, evaluation of ○ was given.

Preparation of Cured Material Layer

The surface sealants obtained in Examples 26 to 34 and Comparative Example 3 and 4 were each printed by a screen printer (Screen Printer Model 2200, manufactured by MITANI) to a glass substrate (7 cm×7 cm×0.7 mm-thickness) previously washed by ozone treatment. The surface sealant was applied such that a dry-state coating of 5 cm×5 cm×3 μm-thickness was obtained. The printed glass substrate was heated on a hot plate heated to 100° C. for 30 minutes to obtain a cured material layer.

The haze value (%) of the cured material layer was measured by a haze meter (name of model TC-H3DPK, manufactured by Tokyo Denshoku Co., Ltd.). Thereafter, the glass substrate having a cured material layer formed thereon was set in a plasma treatment apparatus (name of model PDC210, parallel flat-plate type, manufactured by Yamato Scientific Co., Ltd.) and plasma treatment was carried out at an oxygen flow rate of 20 mL/minute and an RF power of 500 W for 20 minutes. Then, the haze value (%) of the cured material layer after the plasma treatment was measured by use of a haze meter (name of model TC-H3DPK manufactured by Tokyo Denshoku Co., Ltd.). The individual haze measurement values are shown in Table 6.

As mentioned above, by treating a cured material of the surface sealant with plasma and evaluating a change in haze, whether a surface sealant is suitable for a method for manufacturing an organic EL device having a step of irradiating plasma to a cured material of the surface sealant, can be evaluated; at the same time, accelerated evaluation of weather resistance can be made.

For every surface sealant prepared in Examples 26 to 34 and Comparative Example 3 and 4, the haze of a cured material layer before plasma treatment is sufficiently reduced. In the surface sealants of Examples 26 to 34, haze values of the cured material layers after plasma treatment are reduced to less than 30%; whereas in the surface sealants of Comparative Example 3 and 4, the haze value of a cured material layer after plasma treatment exceeds 50%.

Particularly, with respect to the surface sealants of Examples 26 to 32, haze values of the cured material layers after plasma treatment are reduced to less than 20%. This suggests that when the hydrogen atom bound to the 1-position of an imidazole ring of a curing accelerator is replaced by another substituent, a haze increase due to plasma can be more effectively limited.

TABLE 6

| | | Molecular weight | Number of functional groups | Example 26 | Example 27 | Example 28 | Example 29 | Example 30 | Example 31 |
|---|---|---|---|---|---|---|---|---|---|
| Epoxy resin | YL-983U | 338 | 2 | 60 | 60 | 100 | 60 | 60 | 60 |
| | VG-3101L | 592 | 3 | 40 | 40 | | 40 | 40 | 40 |
| | Epoxy equivalent | | | 0.5577 | 0.5577 | 0.5917 | 0.5577 | 0.5577 | 0.5577 |
| Acid anhydride | MH-700 | | | 85 | 85 | 85 | 85 | 85 | 85 |
| Silane coupling agent | KM-403 | | | 4 | 4 | 4 | 4 | 4 | 4 |
| Amine compound | 1.2DMZ | 108 | 2 | 3 | | | | | |
| | 1B2MZ | 184 | 2 | | 2.6 | 2.6 | | | |
| | 1B2PZ | 234 | 2 | | | | 3 | | |
| | IBMI12 | 138 | 2 | | | | | 2.1 | |
| | 3010 | 265 | 3 | | | | | | 3 |
| | K-61B | 409 | 3 | | | | | | |
| | 2P4MZ | 182 | 1 | | | | | | |
| | 2E4MZ | 110 | 1 | | | | | | |
| | SA-810 | 318 | 1 | | | | | | |
| | Tertiary amino group equivalent | | | 0.0556 | 0.0283 | 0.0283 | 0.0256 | 0.0304 | 0.0340 |
| Equivalent ratio of tertiary amino group of amine compound to epoxy group | | | | 0.09961 | 0.05067 | 0.04776 | 0.04597 | 0.05457 | 0.06089 |
| Water content (mass ppm) | | | | 10 | 10 | 10 | 10 | 10 | 10 |
| Physical properties | Curability@100° C. | | | ○ | ○ | ○ | ○ | ○ | ○ |
| | Viscosity (Pa·s) | | | 3.795 | 3.442 | 0.468 | 4.430 | 3.360 | 6.15 |
| | Haze (before plasma treatment) | | | 0.1 | 0.1 | 0.1 | 0.2 | 0.1 | 0.1 |
| | Haze (after plasma treatment) | | | 12.9 | 6.8 | 0.2 | 12.7 | 6.6 | 19.8 |

| | | Molecular weight | Number of functional groups | Example 32 | Example 33 | Example 34 | Comparative Example 3 | Comparative Example 4 |
|---|---|---|---|---|---|---|---|---|
| Epoxy resin | YL-983U | 338 | 2 | 60 | 60 | 60 | 60 | 60 |
| | VG-3101L | 592 | 3 | 40 | 40 | 40 | 40 | 40 |
| | Epoxy equivalent | | | 0.5577 | 0.5577 | 0.5577 | 0.5577 | 0.5577 |
| Acid anhydride | MH-700 | | | 85 | 85 | 85 | 85 | 85 |
| Silane coupling agent | KM-403 | | | 4 | 4 | 4 | 4 | 4 |
| Amine compound | 1.2DMZ | 108 | 2 | | | | | |
| | 1B2MZ | 184 | 2 | | | | | |
| | 1B2PZ | 234 | 2 | | | 1 | | |
| | IBMI12 | 138 | 2 | | | | | |
| | 3010 | 265 | 3 | | | | | |
| | K-61B | 409 | 3 | 3 | | | | |
| | 2P4MZ | 182 | 1 | | 3 | | | |
| | 2E4MZ | 110 | 1 | | | 1.5 | 3 | |
| | SA-810 | 318 | 1 | | | | | 3 |
| | Tertiary amino group equivalent | | | 0.0220 | 0.0165 | 0.0136 | 0.0273 | 0.0094 |
| Equivalent ratio of tertiary amino group of amine compound to epoxy group | | | | 0.03945 | 0.02955 | 0.02445 | 0.0489 | 0.01691 |
| Water content (mass ppm) | | | | 10 | 10 | 10 | 10 | 10 |
| Physical properties | Curability@100° C. | | | ○ | ○ | ○ | ○ | ○ |
| | Viscosity (Pa·s) | | | 3.459 | 3.447 | 4.053 | 4.739 | 2.973 |
| | Haze (before plasma treatment) | | | 0.2 | 0.2 | 0.1 | 0 | 0.1 |
| | Haze (after plasma treatment) | | | 2.4 | 23.5 | 29 | 54.9 | 58.2 |

The present application Claims a priority right based on Japanese Patent Application No. 2011-139578 filed Jun. 23, 2011 and Japanese Patent Application No. 2011-154352 filed Jul. 12, 2011, the contents of which including the specifications and drawings are incorporated by reference in their entirety.

INDUSTRIAL APPLICABILITY

The surface sealant according to Embodiment 1 of the present invention has good curability and excellent storage stability. Thus, the manufacturing efficiency of an optical semiconductor device can be enhanced. Furthermore, in an optical semiconductor device having an optical semiconductor the surface of which is sealed by the cured material layer of the surface sealant according to Embodiment 2 of the present invention, a haze increase of the cured material layer is limited. Particularly, a haze increase of the cured material layer treated with plasma is effectively limited. Accordingly, even when an inorganic compound layer is formed by plasma CVD on the cured material layer, the transparency of the cured material layer can be maintained. Therefore, the optical semiconductor device of the present invention, particularly an organic EL device, is enhanced in light take-out efficiency.

REFERENCE SIGNS LIST 20,20' Organic EL device
22 Substrate
24 Organic EL element
26 Sealing board
28 Surface sealing layer
28-1 Cured material layer
28-2 Passivation layer
28-3 Second resin cured material layer
30 Reflection pixel electrode layer
32 Organic EL layer
34 Transparent counter electrode layer

The invention claimed is:

1. A method for manufacturing an organic electroluminescent (EL) device comprising a substrate, an organic EL element, a cured material layer formed of a cured material of a surface sealant and a passivation film laminated in the order presented, comprising:
a first step of forming the organic EL element on a substrate;
a second step of covering the organic EL element with the surface sealant;
a third step of sealing a surface of the organic EL element with the cured material of the surface sealant; and
a fourth step of forming the passivation film on the cured material sealing the surface of the organic EL element, by plasma CVD or sputtering,
wherein the surface sealant comprises:
an epoxy resin (a) having two or more epoxy groups in a molecule thereof; and
a metal complex (b1) which includes: at least one metal ion selected from the group consisting of Zn, Bi, Ca, Al, Cd, La and Zr; a tertiary amine capable of forming a complex with the metal ion and having no N—H bond; and an anionic ligand,
wherein the anionic ligand has two or more atoms selected from the group consisting of O, S and P which are capable of binding to the metal ion, and the anionic ligand is capable of coordinating with the metal ion to form a 3- to 7-membered ring and has a molecular weight of 17 to 200,
wherein the surface sealant has a viscosity of 10 to 10000 mPa·s, as measured by E-type viscometer at 25° C. and 1.0 rpm, and
wherein a cured material layer of the surface sealant after a plasma treatment has a haze value of 30% or less, the plasma treatment being carried out at an oxygen flow rate of 20 mL/minute and an RF power of 500 W for 20 minutes.

2. The method according to claim 1, wherein a valence of the anionic ligand in the surface sealant is smaller than a valance of the metal ion, and
a radius of the anionic ligand is 2.0 Å or more.

3. The method according to claim 1, wherein the tertiary amine is a compound represented by any one of the following general formulas (1) to (6):

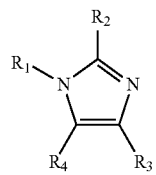

(1)

where $R_1$ represents a $C_{1-17}$ aliphatic hydrocarbon group, a hydroxy group, an aryl-containing group or a cyanoethyl group; and
$R_2$, $R_3$ and $R_4$ each independently represent a hydrogen group, a $C_{1-17}$ aliphatic hydrocarbon group, a hydroxy group, an aryl-containing group or a cyanoethyl group;

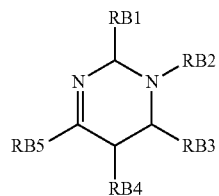

(2)

where RB1, RB3, RB4 and RB5 each independently represent a hydrogen group, a $C_{1-17}$ aliphatic hydrocarbon group optionally containing a hetero atom, a hydroxy group, an aryl-containing group or a cyanoethyl group;
RB2 represents a $C_{1-17}$ aliphatic hydrocarbon group optionally containing a hetero atom, a hydroxy group, an aryl-containing group or a cyanoethyl group; and a plurality of groups selected from RB1, RB2, RB3, RB4 and RB5 optionally joined to each other to form an alicyclic ring, an aromatic ring or a heterocyclic ring having a hetero atom selected from oxygen, nitrogen and sulfur;

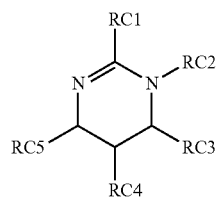

(3)

where RC1, RC3, RC4 and RC5 each independently represent a hydrogen group, a $C_{1-17}$ aliphatic hydrocarbon group optionally containing a hetero atom, a hydroxy group, an aryl-containing group or a cyanoethyl group;

RC2 represents a $C_{1-17}$ aliphatic hydrocarbon group optionally containing a hetero atom, a hydroxy group, an aryl-containing group or a cyanoethyl group; and a plurality of groups selected from RC1, RC2, RC3, RC4 and RC5 may be joined to each other to form an alicyclic ring, an aromatic ring or a heterocyclic ring having a hetero atom selected from oxygen, nitrogen and sulfur;

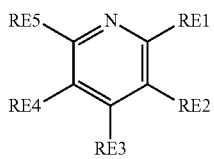

(4)

where RE1, RE2, RE3, RE4 and RE5 each independently represent a hydrogen group, a $C_{1-17}$ aliphatic hydrocarbon group optionally containing a hetero atom, a hydroxy group, an aryl-containing group or a cyanoethyl group; and a plurality of groups selected from RE1, RE2, RE3, RE4 and RE5 optionally joined to each other to form an alicyclic ring, an aromatic ring or a heterocyclic ring having a hetero atom selected from oxygen, nitrogen and sulfur;

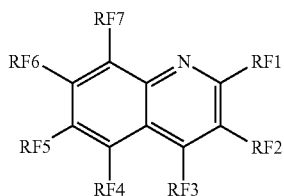

(5)

where RF1, RF2, RF3, RF4, RF5, RF6 and RF7 each independently represent a hydrogen group, a $C_{1-17}$ aliphatic hydrocarbon group optionally containing a hetero atom, a hydroxy group, an aryl-containing group or a cyanoethyl group; and a plurality of groups selected from RF1, RF2, RF3, RF4, RF5, RF6 and RF7 optionally joined to each other to form an alicyclic ring, an aromatic ring or a heterocyclic ring having a hetero atom selected from oxygen, nitrogen and sulfur; and

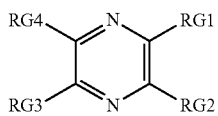

(6)

where RG1, RG2, RG3 and RG4 each independently represent a hydrogen group, a $C_{1-17}$ aliphatic hydrocarbon group optionally containing a hetero atom, a hydroxy group, an aryl-containing group or a cyanoethyl group; and a plurality of groups selected from RG1, RG2, RG3 and RG4 optionally joined to each other to form an alicyclic ring, an aromatic ring or a heterocyclic ring having a hetero atom selected from oxygen, nitrogen and sulfur.

4. The method according to claim 3, wherein the tertiary amine is a compound represented by any one of the general formulas (1) to (3) and the anionic ligand is a carboxylate compound represented by the following general formula (7A):

(7A)

where RD1 is free or a hydrogen atom and RD2 is a hydrogen group, a $C_{1-10}$ hydrocarbon group or a hydroxy group.

5. The method according to claim 1, wherein among chemical shift peaks in $^1$HNMR spectroscopy (in $CDCl_3$, 25° C., 270 MHz) of the surface sealant, chemical shift peaks of the tertiary amine include a peak which is shifted by 0.05 ppm or more relative to a chemical shift peak in $^1$HNMR spectroscopy (in $CDCl_3$, 25° C., 270 MHz) of the tertiary amine alone.

6. The method according to claim 1, wherein a molar ratio of the tertiary amine to the metal ion is 0.5:1 to 6.0:1.

7. The method according to claim 4, wherein the carboxylate compound is at least one compound selected from the group consisting of 2-ethylhexanoic acid, formic acid, acetic acid, butanoic acid, 2-ethylbutanoic acid, 2,2-dimethylbutanoic acid, 3-methylbutanoic acid, 2,2-dimethylpropanoic acid, benzoic acid and naphthenic acid.

8. The method according to claim 1, wherein the tertiary amine is at least one compound selected from the group consisting of 1,8-diazobicyclo[5,4,0]undec-7-ene, 1-methylimidazole, 1,2-dimethylimidazole, 1-benzyl-2-methylimidazole, 1-isobutyl-2-methylimidazole, 1-butylimidazole and 1,5-diazobicyclo[4,3,0]non-5-en.

9. The method according to claim 1, wherein the surface sealant includes the metal complex (b1) so that an equivalent ratio of a tertiary amine active functional group to an epoxy group is in the range of 0.008:1 to 0.3:1.

10. The method according to claim 1, wherein the surface sealant further comprising an acid anhydride so that an equivalent ratio of an acid anhydride group to an epoxy group is in the range of 0.8:1 to 1.2:1.

11. The method according to claim 1, wherein the surface sealant has a water content of 0.1 wt % or less.

12. An organic EL device comprising:
an organic EL element;
a cured material layer formed of a cured material of a surface sealant, the cured material layer sealing a surface of the organic EL element while being in contact with the organic EL element; and
a passivation layer in contact with the cured material layer, in the order presented,
wherein the surface sealant comprising:
an epoxy resin (a) having two or more epoxy groups in a molecule thereof: and
a metal complex (b1) which includes: at least one metal ion selected from the group consisting of Zn, Bi, Ca, Al, Cd, La and Zr; a tertiary amine capable of forming a complex with the metal ion and having no N—H bond; and an anionic ligand,
wherein the anionic ligand has two or more atoms selected from the group consisting of O, S and P which are capable of binding to the metal ion, and the anionic ligand is capable of coordinating with the metal ion to form a 3- to 7-membered ring and has a molecular weight of 17 to 200, wherein the surface sealant has a viscosity of 10 to 10000 mPa·s, as measured by E-type viscometer at 25° C. and 1.0 rpm, and wherein a cured material layer of the surface sealant after a plasma treatment has a haze value of 30% or less, the plasma treatment being carried out at an oxygen flow rate of 20 mL/minute and an RF power of 500 W for 20 minutes.

13. The organic EL device according to claim 12, wherein the cured material layer is formed of an epoxy resin composition, and a spectrum of X-ray photoelectron spectroscopy (XPS) of the epoxy resin composition includes a peak derived from at least one metal atom selected from the group consisting of Zn, Bi, Ca, Al, Cd, La and Zr and a peak derived from a nitrogen atom, with a molar ratio of the metal atom to the nitrogen atom being 1:0.5 to 1:6.0, the cured material layer containing the metal atom in an amount of 0.5 to 15 mass %.

14. An organic EL display panel including the organic EL device according to claim 12.

15. The organic EL device according to claim 12, wherein a valence of the anionic ligand in the surface sealant is smaller than a valance of the metal ion, and a radius of the anionic ligand is 2.0 Å or more.

16. The organic EL device according to claim 12, wherein the tertiary amine is a compound represented by any one of the following general formulas (1) to (6):

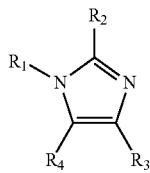

(1)

where $R_1$ represents a $C_{1-17}$ aliphatic hydrocarbon group, a hydroxy group, an aryl-containing group or a cyanoethyl group; and $R_2$, $R_3$ and $R_4$ each independently represent a hydrogen group, a $C_{1-17}$ aliphatic hydrocarbon group, a hydroxy group, an aryl-containing group or a cyanoethyl group;

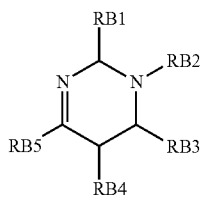

(2)

where RB1, RB3, RB4 and RB5 each independently represent a hydrogen group, a $C_{1-17}$ aliphatic hydrocarbon group optionally containing a hetero atom, a hydroxy group, an aryl-containing group or a cyanoethyl group;

RB2 represents a $C_{1-17}$ aliphatic hydrocarbon group optionally containing a hetero atom, a hydroxy group, an aryl-containing group or a cyanoethyl group; and a plurality of groups selected from RB1, RB2, RB3, RB4 and RB5 optionally joined to each other to form an alicyclic ring, an aromatic ring or a heterocyclic ring having a hetero atom selected from oxygen, nitrogen and sulfur;

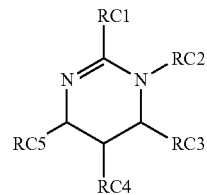

(3)

where RC1, RC3, RC4 and RC5 each independently represent a hydrogen group, a $C_{1-17}$ aliphatic hydrocarbon group optionally containing a hetero atom, a hydroxy group, an aryl-containing group or a cyanoethyl group;

RC2 represents a $C_{1-17}$ aliphatic hydrocarbon group optionally containing a hetero atom, a hydroxy group, an aryl-containing group or a cyanoethyl group; and a plurality of groups selected from RC1, RC2, RC3, RC4 and RC5 optionally joined to each other to form an alicyclic ring, an aromatic ring or a heterocyclic ring having a hetero atom selected from oxygen, nitrogen and sulfur;

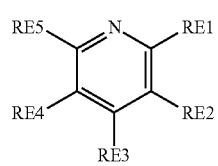

(4)

where RE1, RE2, RE3, RE4 and RE5 each independently represent a hydrogen group, a $C_{1-17}$ aliphatic hydrocarbon group optionally containing a hetero atom, a hydroxy group, an aryl-containing group or a cyanoethyl group; and a plurality of groups selected from RE1, RE2, RE3, RE4 and RE5 optionally joined to each other to form an alicyclic ring, an aromatic ring or a heterocyclic ring having a hetero atom selected from oxygen, nitrogen and sulfur;

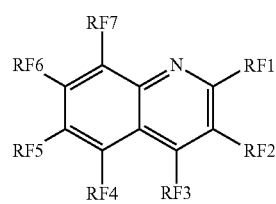

(5)

where RF1, RF2, RF3, RF4, RF5, RF6 and RF7 each independently represent a hydrogen group, a $C_{1-17}$ aliphatic hydrocarbon group optionally containing a hetero atom, a hydroxy group, an aryl-containing group or a cyanoethyl group; and a plurality of groups selected from RF1, RF2, RF3, RF4, RF5, RF6 and RF7 optionally joined to each other to form an alicyclic ring, an aromatic ring or a heterocyclic ring having a hetero atom selected from oxygen, nitrogen and sulfur; and

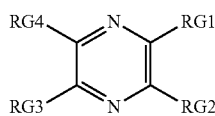

(6)

where RG1, RG2, RG3 and RG4 each independently represent a hydrogen group, a $C_{1-17}$ aliphatic hydrocarbon group optionally containing a hetero atom, a hydroxy group, an aryl-containing group or a cyanoethyl group; and a plurality of groups selected from RG1, RG2, RG3 and RG4 optionally joined to each other to form an alicyclic ring, an aromatic ring or a heterocyclic ring having a hetero atom selected from oxygen, nitrogen and sulfur.

17. The organic EL device according to claim 16, wherein the tertiary amine is a compound represented by any one of the general formulas (1) to (3) and the anionic ligand is a carboxylate compound represented by the following general formula (7A):

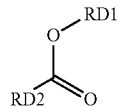

(7A)

where RD1 is free or a hydrogen atom and
RD2 is a hydrogen group, a $C_{1-10}$ hydrocarbon group or a hydroxy group.

18. The organic EL device according to claim 12, wherein among chemical shift peaks in $^1$HNMR spectroscopy (in CDCl$_3$, 25° C., 270 MHz) of the surface sealant, chemical shift peaks of the tertiary amine include a peak which is shifted by 0.05 ppm or more relative to a chemical shift peak in $^1$HNMR spectroscopy (in CDCl$_3$, 25° C., 270 MHz) of the tertiary amine alone.

19. The organic EL device according to claim 12, wherein a molar ratio of the tertiary amine to the metal ion is 0.5:1 to 6.0:1.

20. The organic EL device according to claim 17, wherein the carboxylate compound is at least one compound selected from the group consisting of 2-ethylhexanoic acid, formic acid, acetic acid, butanoic acid, 2-ethylbutanoic acid, 2,2-dimethylbutanoic acid, 3-methylbutanoic acid, 2,2-dimethylpropanoic acid, benzoic acid and naphthenic acid.

21. The organic EL device according to claim 12, wherein the tertiary amine is at least one compound selected from the group consisting of 1,8-diazobicyclo[5,4,0]undec-7-ene, 1-methylimidazole, 1,2-dimethylimidazole, 1-benzyl-2-methylimidazole, 1-isobutyl-2-methylimidazole, 1-butylimidazole and 1,5-diazobicyclo[4,3,0]non-5-en.

22. The organic EL device according to claim 12, wherein the surface sealant includes the metal complex (b1) so that an equivalent ratio of a tertiary amine active functional group to an epoxy group is in the range of 0.008:1 to 0.3:1.

23. The organic EL device according to claim 12, wherein the surface sealant further comprising an acid anhydride so that an equivalent ratio of an acid anhydride group to an epoxy group is in the range of 0.8:1 to 1.2:1.

24. The organic EL device according to claim 12, wherein the surface sealant has a water content of 0.1 wt % or less.

* * * * *